(12) United States Patent
Fukunaga et al.

(10) Patent No.: US 7,893,449 B2
(45) Date of Patent: Feb. 22, 2011

(54) GALLIUM NITRIDE BASED COMPOUND SEMICONDUCTOR LIGHT-EMITTING DEVICE HAVING HIGH EMISSION EFFICIENCY AND METHOD OF MANUFACTURING THE SAME

(75) Inventors: Naoki Fukunaga, Chiba (JP); Hironao Shinohara, Ichihara (JP); Hiroshi Osawa, Chiba (JP)

(73) Assignee: Showa Denko K.K., Tokyo (JP)

( * ) Notice: Subject to any disclaimer, the term of this patent is extended or adjusted under 35 U.S.C. 154(b) by 315 days.

(21) Appl. No.: 12/097,054

(22) PCT Filed: Dec. 13, 2006

(86) PCT No.: PCT/JP2006/324856

§ 371 (c)(1),
(2), (4) Date: Jun. 12, 2008

(87) PCT Pub. No.: WO2007/069651

PCT Pub. Date: Jun. 21, 2007

(65) Prior Publication Data

US 2009/0278158 A1 Nov. 12, 2009

(30) Foreign Application Priority Data

Dec. 14, 2005 (JP) .............................. 2005-360288
Dec. 14, 2005 (JP) .............................. 2005-360289

(51) Int. Cl.
*H01L 29/22* (2006.01)
(52) U.S. Cl. ................................. 257/98; 257/E33.074
(58) Field of Classification Search .................. 257/95, 257/98, 99, E33.068, E33.074
See application file for complete search history.

(56) References Cited

U.S. PATENT DOCUMENTS

| 6,924,163 | B2 | 8/2005 | Okazaki et al. |
| 2004/0104399 | A1 | 6/2004 | Ou et al. |
| 2005/0104080 | A1* | 5/2005 | Ichihara et al. ............... 257/98 |
| 2005/0104081 | A1 | 5/2005 | Kim et al. |

(Continued)

FOREIGN PATENT DOCUMENTS

JP 06-291368 A 10/1994

(Continued)

OTHER PUBLICATIONS

Hung-Wen Huang, et al., "Improvement of InGaN-GaN Light-Emitting Diode Performance with a Nano-Roughened p-GaN Surface", IEEE Photonics Technology Letters, May 2005, pp., 983-985, vol. 17, No. 5.

(Continued)

*Primary Examiner*—Thomas L Dickey
(74) *Attorney, Agent, or Firm*—Sughrue Mion, PLLC

(57) ABSTRACT

The present invention provides a gallium nitride based compound semiconductor light-emitting device having high light emission efficiency and a low driving voltage Vf. The gallium nitride based compound semiconductor light-emitting device includes a p-type semiconductor layer, and a transparent conductive oxide film that includes dopants and is formed on the p-type semiconductor layer. A dopant concentration at an interface between the p-type semiconductor layer and the transparent conductive oxide film is higher than the bulk dopant concentration of the transparent conductive oxide film. Therefore, the contact resistance between the p-type semiconductor layer and the transparent conductive oxide film is reduced.

11 Claims, 6 Drawing Sheets

U.S. PATENT DOCUMENTS

2005/0212002 A1 9/2005 Sanga et al.

FOREIGN PATENT DOCUMENTS

| | | |
|---|---|---|
| JP | 09-129919 A | 5/1997 |
| JP | 2000-164928 A | 6/2000 |
| JP | 2000-196152 A | 7/2000 |
| JP | 2005-244128 A | 9/2005 |
| JP | 2005-244129 A | 9/2005 |
| JP | 2005-259970 A | 9/2005 |
| JP | 2005-317931 A | 11/2005 |
| KR | 10-2005-0092947 A | 9/2005 |
| TW | 558846 | 10/2003 |
| TW | I234298 | 6/2005 |

OTHER PUBLICATIONS

Foreign Office Action for Korea Patent Application No. 10-2008-7014721, mailed Apr. 26, 2010.

* cited by examiner

GALLIUM NITRIDE BASED COMPOUND SEMICONDUCTOR LIGHT-EMITTING DEVICE HAVING HIGH EMISSION EFFICIENCY AND METHOD OF MANUFACTURING THE SAME

TECHNICAL FIELD

The present invention relates to a gallium nitride based compound semiconductor light-emitting device, and more particularly, to a gallium nitride based compound semiconductor light-emitting device having a low driving voltage Vf and a method of manufacturing the same.

Priority is claimed on Japanese Patent Application Nos. 2005-360288 and 2005-360289, filed Dec. 14, 2005, the content of which is incorporated herein by reference.

BACKGROUND ART

In recent years, gallium nitride based compound semiconductor light-emitting devices have drawn attention as short wavelength light-emitting devices. The gallium nitride based compound semiconductor light-emitting device is formed on various kinds of substrates, such as a sapphire single crystal substrate, an oxide substrate, and a III-V group compound substrate, by a metal organic chemical vapor deposition (MOCVD) method or a molecular beam epitaxy (MBE) method.

The gallium nitride based compound semiconductor light-emitting device is characterized in that a small amount of current is diffused in the horizontal direction. Therefore, a current is applied to only a semiconductor immediately below an electrode, and light emitted from a light-emitting layer immediately below the electrode is shielded by the electrode, which makes it difficult to emit light from the light-emitting device to the outside. In addition, in the light-emitting device, a transparent electrode is generally used as a positive electrode, and light is emitted to the outside through the positive electrode.

The positive electrode composed of the transparent electrode is formed of a known conductive material, such as Ni/Au or ITO($In_2O_3$—$SnO_2$). Metallic materials, such as Ni/Au, have low contact resistance with a p-type semiconductor layer, but have low light transmittance. On the other hand, oxides, such as ITO, have high a light transmittance, but have a high contact resistance.

For this reason, in the related art, the positive electrode used for the gallium nitride based compound semiconductor light-emitting device is formed by combining a contact metal layer with a metal oxide layer formed of a high conductive material, such as ITO (for example, Patent Document 1, i.e. JP-A-9-129919).

The contact metal layer has been formed of a metallic material having a large work function, such as Pt or Rh, in order to reduce contact resistance with the p-type semiconductor layer.

However, in the gallium nitride based compound semiconductor light-emitting device disclosed in Patent Document 1, the contact metal layer used for the positive electrode can reduce the contact resistance with the p-type semiconductor layer, but it is difficult to obtain sufficient light emission efficiency since the transmittance of the contact metal layer is low, which results in low emission power.

A method of increasing the transmittance of each layer has been proposed to improve light emission efficiency and thus increase the emission power in the gallium nitride based compound semiconductor light-emitting device. In addition, another method has been proposed which improves the light emission efficiency by forming a rough emission surface to emit light at various angles (for example, Patent Document 2, i.e. JP-A-6-291368).

In the gallium nitride based compound semiconductor light-emitting device disclosed in Patent Document 2, the formation of the rough emission surface enables the light-emitting layer to have a refractive index of about 2.5 that is considerably higher than that of air, which is 1, and a small threshold angle of about 25°. Therefore, it is possible to prevent no light from being emitted to the outside due to the repeated reflection and absorption of light in the crystal. As a result, the light emission efficiency is improved.

However, in the gallium nitride based compound semiconductor light-emitting device disclosed in Patent Document 2, the formation of the rough emission surface makes it possible to improve the light emission efficiency, but during a process of forming the rough emission surface, the rough emission surface is damaged, which results in an increase in the contact resistance with the electrode.

In order to solve the problem of the increase in the contact resistance, a light-emitting device having a low contact resistance has been proposed in which a rough emission surface is formed on a gallium nitride based compound semiconductor light-emitting device, a metal layer including a Mg layer and a Au layer is provided in the vicinity of the surface of a p-type semiconductor layer, and a heat treatment is performed to reduce the contact resistance (for example, Patent Document 3, i.e. JP-A-2000-196152).

However, in the gallium nitride based compound semiconductor light-emitting device disclosed in Patent Document 3, after the metal layer including the Mg layer and the Au layer is formed, the heat treatment needs to be performed, and the metal layer needs to be removed. As a result, the number of processes significantly increases, and thus manufacturing costs increase. In addition, it is necessary to use a strong acid, such as aqua regia, in order to remove the Au layer. In this case, there is a fear that the surface of the gallium nitride based compound semiconductor will be damaged.

The invention has been made in order to solve the above problems, and an object of the invention is to provide a gallium nitride based compound semiconductor light-emitting device capable of obtaining high light emission efficiency by increasing the dopant concentration of a transparent conductive oxide film, without using a contact metal layer having a low light transmittance for a positive electrode, and reducing contact resistance with a p-type semiconductor layer to lower a driving voltage Vf, and a method of manufacturing the same.

Another object of the invention is to provide a gallium nitride based compound semiconductor light-emitting device capable of reducing contact resistance between a transparent conductive oxide film and a p-type semiconductor layer having an uneven surface on at least a portion thereof to reduce a driving voltage Vf and improving light emission efficiency, by increasing the dopant concentration of the transparent conductive oxide film, without using a contact metal layer having low light transmittance, and a method of manufacturing the same.

DISCLOSURE OF INVENTION

The inventors have conceived the present invention in order to solve the above problems.

That is, the invention is as follows.

According to a first aspect of the present invention, a gallium nitride based compound semiconductor light-emitting device includes: a gallium nitride based compound semiconductor device including a p-type semiconductor layer; and a transparent conductive oxide film that includes dopants and is formed on the p-type semiconductor layer. A dopant concentration at an interface between the p-type semiconductor layer and the transparent conductive oxide film is higher than a bulk dopant concentration of the transparent conductive oxide film.

According to a second aspect of the present invention, in the gallium nitride based compound semiconductor light-emitting device according to the first aspect, preferably, an uneven surface is formed on at least a portion of the p-type semiconductor layer.

According to a third aspect of the present invention, in the gallium nitride based compound semiconductor light-emitting device according to the first or second aspect, preferably, the dopant concentration of the transparent conductive oxide film is the highest at the interface between the transparent conductive oxide film and the p-type semiconductor layer.

According to a fourth aspect of the present invention, in the gallium nitride based compound semiconductor light-emitting device according to any one of the first to third aspects, preferably, a highly doped region having a dopant concentration that is higher than that of the transparent conductive oxide film is provided between the p-type semiconductor layer of the gallium nitride based compound semiconductor device and the transparent conductive oxide film.

According to a fifth aspect of the present invention, in the gallium nitride based compound semiconductor light-emitting device according to the fourth aspect, preferably, the highly doped region is formed of any one of a dopant, a dopant oxide, and a transparent conductive material having a dopant concentration that is higher than that of the transparent conductive oxide film.

According to a sixth aspect of the present invention, in the gallium nitride based compound semiconductor light-emitting device according to the fourth or fifth aspect, preferably, the highly doped region is formed of any one of Sn, $SnO_2$, and $ITO(In_2O_3$—$SnO_2)$ having a Sn concentration that is higher than that of the transparent conductive oxide film.

According to a seventh aspect of the present invention, in the gallium nitride based compound semiconductor light-emitting device according to any one of the first to sixth aspects, preferably, in the interface between the p-type semiconductor layer of the gallium nitride based compound semiconductor device and the transparent conductive oxide film, a region having a dopant concentration that is higher than the bulk dopant concentration of the transparent conductive oxide film exists in the range of 0.1 nm to 20 nm from the center of the interface.

According to an eighth aspect of the present invention, in the gallium nitride based compound semiconductor light-emitting device according to any one of the first to sixth aspects, preferably, in the interface between the p-type semiconductor layer of the gallium nitride based compound semiconductor device and the transparent conductive oxide film, a region having a dopant concentration that is higher than the bulk dopant concentration of the transparent conductive oxide film exists in the range of 0.1 nm to 10 nm from the center of the interface.

According to a ninth aspect of the present invention, in the gallium nitride based compound semiconductor light-emitting device according to any one of the first to sixth aspects, preferably, in the interface between the p-type semiconductor layer of the gallium nitride based compound semiconductor device and the transparent conductive oxide film, a region having a dopant concentration that is higher than the bulk dopant concentration of the transparent conductive oxide film exists in the range of 0.1 nm to 3 nm from the center of the interface.

According to a tenth aspect of the present invention, in the gallium nitride based compound semiconductor light-emitting device according to any one of the first to ninth aspects, preferably, the transparent conductive oxide film is formed of at least one of $ITO(In_2O_3$—$SnO_2)$, $AZO(ZnO$—$Al_2O_3)$, $IZO$ $(In_2O_3$—$ZnO)$, and $GZO(ZnO$—$GeO_2)$.

According to an eleventh aspect of the present invention, in the gallium nitride based compound semiconductor light-emitting device according to the tenth aspect, preferably, the transparent conductive oxide film contains at least ITO $(In_2O_3$—$SnO_2)$.

According to a twelfth aspect of the present invention, in the gallium nitride based compound semiconductor light-emitting device according to any one of the first to eleventh aspects, preferably, the thickness of the transparent conductive oxide film is in the range of 35 nm to 10000 nm (10 μm).

According to a thirteenth aspect of the present invention, in the gallium nitride based compound semiconductor light-emitting device according to any one of the first to eleventh aspects, preferably, the thickness of the transparent conductive oxide film is in the range of 100 nm to 1000 nm (1 μm).

According to a fourteenth aspect of the present invention, there is provided a method of manufacturing a gallium nitride based compound semiconductor light-emitting device. The method includes: forming a transparent conductive oxide film including dopants on a p-type semiconductor layer of a gallium nitride based compound semiconductor device; and performing a thermal annealing process at a temperature in the range of 200° C. to 900° C.

According to a fifteenth aspect of the present invention, there is provided a method of manufacturing a gallium nitride based compound semiconductor light-emitting device. The method includes: forming a transparent conductive oxide film including dopants on a p-type semiconductor layer of a gallium nitride based compound semiconductor device; and performing a thermal annealing process at a temperature of 300° C. to 600° C.

According to a sixteenth aspect of the present invention, there is provided a method of manufacturing a gallium nitride based compound semiconductor light-emitting device. The method includes: forming a transparent conductive oxide film including dopants on a p-type semiconductor layer of a gallium nitride based compound semiconductor device; and performing a laser annealing process using an excimer laser.

According to a seventeenth aspect of the present invention, in the method of manufacturing a gallium nitride based compound semiconductor light-emitting device according to any one of the fourteenth to sixteenth aspects, preferably, before the transparent conductive oxide film including the dopants is formed on the p-type semiconductor layer, an uneven surface is formed on at least a portion of the p-type semiconductor layer.

According to an eighteenth aspect of the present invention, there is provided a method of manufacturing a gallium nitride based compound semiconductor light-emitting device. The method includes: sequentially forming a highly doped layer and a transparent conductive oxide film on a p-type semiconductor layer of a gallium nitride based compound semiconductor device; and performing a thermal annealing process at a temperature in the range of 200° C. to 900° C.

According to a nineteenth aspect of the present invention, there is provided a method of manufacturing a gallium nitride based compound semiconductor light-emitting device. The method includes: sequentially forming a highly doped layer and a transparent conductive oxide film on a p-type semiconductor layer of a gallium nitride based compound semiconductor device; and performing a thermal annealing process at a temperature of 300° C. to 600° C.

According to a twentieth aspect of the present invention, in the method of manufacturing a gallium nitride based compound semiconductor light-emitting device according to the eighteenth or nineteenth aspect, preferably, before the highly doped layer and the transparent conductive oxide film are sequentially formed on the p-type semiconductor layer, an uneven surface is formed on at least a portion of the p-type semiconductor layer.

According to a twenty-first aspect of the present invention, there is provided a method of manufacturing a gallium nitride based compound semiconductor light-emitting device in which an uneven surface is formed on at least a portion of a p-type semiconductor layer of a gallium nitride based compound semiconductor device and a transparent conductive oxide film having a high dopant concentration is formed on the p-type semiconductor layer. The method includes: (1) a process of sequentially forming on a substrate an n-type semiconductor layer, a light-emitting layer, and a p-type semiconductor layer each composed of a gallium nitride based compound semiconductor; (2) a process of forming a mask made of metal particles on the p-type semiconductor layer; and (3) a process of performing dry etching on the p-type semiconductor layer using the mask.

According to a twenty-second aspect of the present invention, in the method of manufacturing a gallium nitride based compound semiconductor light-emitting device according to the twenty-first aspect, preferably, the process (2) includes: forming a metal thin film on the p-type semiconductor layer; and performing a heat treatment.

According to a twenty-third aspect of the present invention, in the method of manufacturing a gallium nitride based compound semiconductor light-emitting device according to the twenty-first or twenty-second aspect, preferably, the metal particles of the mask are made of Ni, or a Ni alloy.

According to a twenty-fourth aspect of the present invention, in the method of manufacturing a gallium nitride based compound semiconductor light-emitting device according to any one of the twenty-first to twenty-third aspects, preferably, the metal particles of the mask are made of a metal with a low melting point or an alloy metal with a low melting point having a melting point in the range of 100° C. to 450° C.

According to a twenty-fifth aspect of the present invention, in the method of manufacturing a gallium nitride based compound semiconductor light-emitting device according to any one of the twenty-first to twenty-fourth aspects, preferably, the metal particles of the mask are made of a metal with a low melting point selected from Ni, Au, Sn, Ge, Pb, Sb, Bi, Cd, and In, or an alloy metal with a low melting point including at least one of the metallic materials.

According to a twenty-sixth aspect of the present invention, in the method of manufacturing a gallium nitride based compound semiconductor light-emitting device according to any one of the twenty-first to twenty-fifth aspects, preferably, the uneven surface is formed on at least a portion of the p-type semiconductor layer by wet etching.

According to a twenty-seventh aspect of the present invention, there is provided a lamp including the gallium nitride based compound semiconductor light-emitting device according to any one of the first to thirteenth aspects.

According to a twenty-eighth aspect of the present invention, there is provided a lamp including the gallium nitride based compound semiconductor light-emitting device manufactured by the method according to any one of the fourteenth to twenty-sixth aspects.

According to the gallium nitride based compound semiconductor light-emitting device of the above-mentioned aspects, a highly doped region is provided at the interface between the p-type semiconductor layer of the gallium nitride based compound semiconductor device and the transparent conductive oxide film. Therefore, the contact resistance between the p-type semiconductor layer and the transparent conductive oxide film is reduced, and thus the driving voltage Vf is reduced. In addition, it is possible to obtain a gallium nitride based compound semiconductor light-emitting device having high light emission efficiency.

Further, according to the gallium nitride based compound semiconductor light-emitting device of the above-mentioned aspects, the transparent conductive oxide film is used in which a highly doped region is provided in the vicinity of only the interface between the p-type semiconductor layer of the gallium nitride based compound semiconductor device and the transparent conductive oxide film, and the other regions other than the highly doped region have a dopant concentration allowing specific resistance to be the lowest. According to this structure, it is possible to reduce the resistance of the positive electrode of the gallium nitride based compound semiconductor light-emitting device, and thus reduce the driving voltage Vf.

Furthermore, according to the gallium nitride based compound semiconductor light-emitting device of the above-mentioned aspects, a high doped region is provided at the interface between the transparent conductive oxide film and the p-type semiconductor layer having an uneven surface on at least a portion thereof. According to this structure, it is possible to reduce the contact resistance between the transparent conductive oxide film and the p-type semiconductor layer, and thus reduce the driving voltage Vf. In addition, it is possible to obtain a gallium nitride based compound semiconductor light-emitting device having high light emission efficiency.

Moreover, according to the gallium nitride based compound semiconductor light-emitting device of the above-mentioned aspects, the transparent conductive oxide film is used in which a highly doped region is provided in the vicinity of only the interface between the transparent conductive oxide film and the p-type semiconductor layer having an uneven surface on at least a portion thereof, and the other regions other than the highly doped region have a dopant concentration allowing specific resistance to be the lowest. According to this structure, it is possible to reduce the resistance of the positive electrode of the gallium nitride based compound semiconductor light-emitting device, and thus reduce the driving voltage Vf. In addition, it is possible to obtain a gallium nitride based compound semiconductor light-emitting device having high light emission efficiency.

BEST MODE FOR CARRYING OUT THE INVENTION

First Embodiment

Hereinafter, a gallium nitride based compound semiconductor light-emitting device according to a first embodiment of the invention will be described with reference to FIGS. 1 to 4.

Figure 1:
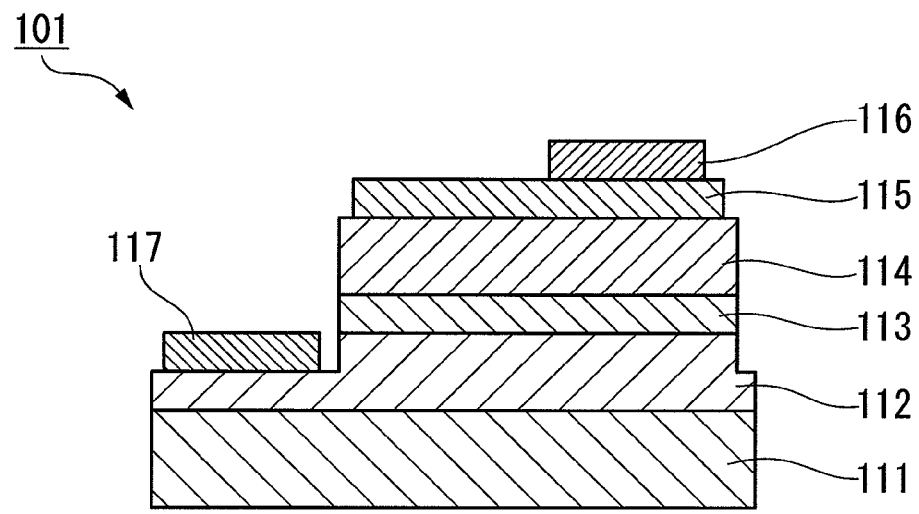
FIG. 1 is a cross-sectional view schematically illustrating the structure of a gallium nitride based compound semiconductor light-emitting device according to an embodiment of the present invention.

As shown in FIG. 1, a gallium nitride based compound semiconductor light-emitting device 101 according to this embodiment has a schematic structure in which an n-type GaN layer 112, a light-emitting layer 113, and a p-type GaN layer (p-type semiconductor layer) 114 are laminated on a substrate 111 in this order to form a gallium nitride based compound semiconductor device, a positive electrode 115 composed of a transparent conductive oxide film including dopants is formed on the p-type GaN layer 114 of the gallium nitride based compound semiconductor device, and the dopant concentration of an interface between the p-type GaN layer 114 and the positive electrode (transparent conductive oxide film) 115 is higher than the bulk dopant concentration of the transparent conductive oxide film forming the positive electrode 115.

The positive electrode composed of the transparent conductive oxide film according to this embodiment of the invention can be used for a gallium nitride based compound semiconductor light-emitting device according to the related art in which gallium nitride based compound semiconductors are laminated on a substrate with a buffer layer interposed therebetween to form an n-type semiconductor layer, a light-emitting layer, and a p-type semiconductor layer, without any restrictions.

The substrate 111 may be formed of any known substrate materials including oxide single crystals, such as sapphire single crystal ($Al_2O_3$; an A-plane, a C-plane, an M-plane, or an R-plane), spinel single crystal ($MgAl_2O_4$), ZnO single crystal, $LiAlO_2$ single crystal, $LiGaO_2$ single crystal, or MgO single crystal, Si single crystal, SiC single crystal, GaAs single crystal, AlN single crystal, GaN single crystal, and boride single crystal, such as $ZrB_2$. In addition, the plane direction of the substrate is not particularly limited. As the substrate, a just substrate or an off-angle substrate may be used.

The n-type GaN layer (n-type semiconductor layer) 112, the light-emitting layer 113, and the p-type GaN layer (p-type semiconductor layer) 114 may have various known structures. In particular, a p-type semiconductor layer having a general carrier concentration may be used, and the transparent positive electrode 115 used in this embodiment of the invention may be applied to a p-type semiconductor layer having a relatively low carrier concentration of, for example, about $1 \times 10^{17}$ cm$^{-3}$.

As the gallium nitride based compound semiconductor, semiconductors having various compositions, which are represented by a general formula $Al_xIn_yGa_{1-x-y}N$ ($0 \leq x < 1$, $0 \leq y < 1$, and $0 \leq x+y < 1$), have been known. In the invention, also, any of the semiconductors having various compositions, which are represented by the general formula $Al_xIn_yGa_{1-x-y}N$ ($0 \leq x \leq 1$, $0 \leq y < 1$, and $0 < x+y < 1$), may be used as the gallium nitride based compound semiconductors forming the n-type semiconductor layer, the light-emitting layer, and the p-type semiconductor layer according to this embodiment, without any restrictions.

A method of growing the gallium nitride based compound semiconductor is not particularly limited. For example, any method of growing a group-III nitride semiconductor, such as an MOCVD (metal organic chemical vapor deposition) method, an HVPE (hydride vapor phase epitaxy) method, or an MBE (molecular beam epitaxy) method, may be used to grow the gallium nitride based compound semiconductor. The MOCVD method is preferable in terms of the control of the thickness of a film and mass production. In the MOCVD method, hydrogen ($H_2$) or nitrogen ($N_2$) is used as a carrier gas, trimethylgallium (TMG) or triethylgallium (TEG) is used as a Ga source, which is a group-III element, trimethylaluminum (TMA) or triethyl aluminum (TEA) is used as an Al source, trimethylindium (TMI) or triethylindium (TEI) is used as an In source, and ammonium ($NH_3$) or hydrazine ($N_2H_4$) is used as a nitrogen (N) source, which is a group-V element. In addition, for example, Si-based materials, such as monosilane ($SiH_4$) and disilane ($Si_2H_6$), and Ge-based materials, such as germane ($GeH_4$), are used as n-type dopants, and Mg-based materials, such as bis-cyclopentadienylmagnesium ($Cp_2Mg$) and bisethylcyclopentadienyl magnesium (($EtCp)_2Mg$), are used as p-type dopants.

Figure 3:
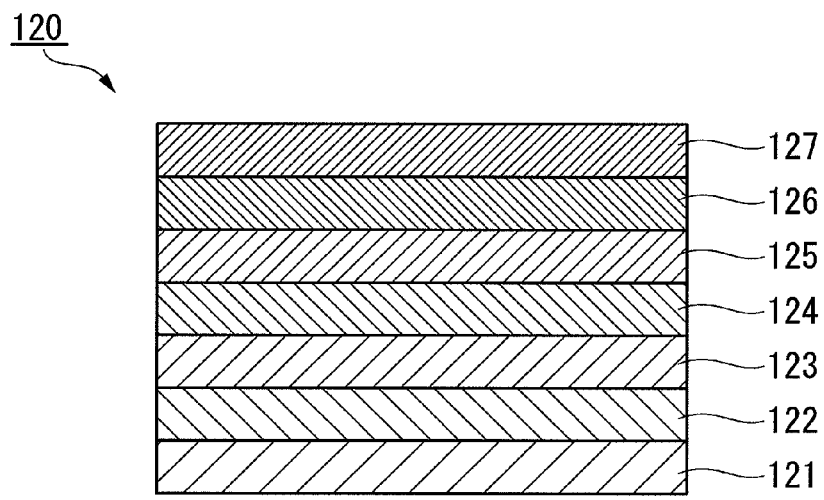
FIG. 3 is a cross-sectional view schematically illustrating a laminated structure of gallium nitride based compound semiconductors in the gallium nitride based compound semiconductor light-emitting device according to the embodiment of the present invention.

As an example of the gallium nitride based compound semiconductor, a gallium nitride based compound semiconductor 120 having the laminated structure shown in FIG. 3 may be used in which a buffer layer (not shown) made of AlN is formed on a substrate 121 made of sapphire, and a GaN underlying layer 122, an n-type GaN contact layer 123, an n-type AlGaN clad layer 124, a light-emitting layer 125 made of InGaN, a p-type AlGaN clad layer 126, and a p-type GaN contact layer 127 are sequentially formed on the buffer layer.

In addition, the p-type GaN contact layer 127, the p-type AlGaN clad layer 126, the light-emitting layer 125, and the n-type AlGaN clad layer 124 composed of the gallium nitride based compound semiconductors shown in FIG. 3 are partially etched such that the n-type GaN contact layer 123 is exposed. Then, a known negative electrode made of, for example, Ti/Au is provided on the n-type GaN contact layer 123, and a positive electrode is provided on the p-type GaN contact layer 127, thereby forming a gallium nitride based compound semiconductor light-emitting device.

The positive electrode 115 is composed of a transparent conductive oxide film layer that contacts at least the p-type semiconductor layer (p-type GaN layer 114). A positive electrode bonding pad 116 for electrical connection to, for example, a circuit board or a lead frame is provided on a portion of the transparent conductive oxide film layer.

The transparent conductive oxide film is formed of an oxide including dopants. For example, the transparent conductive oxide film is preferably formed of a material having high transmittance and low specific resistance, such as ITO ($In_2O_3$—$SnO_2$), AZO (ZnO—$Al_2O_3$), IZO (ZnO—$In_2O_3$), or GZO (ZnO—$GeO_2$). In particular, ITO capable of obtaining low specific resistance is preferably used to reduce a driving voltage Vf. When AZO or GZO is used, the specific resistance thereof is higher than that of ITO, and thus the driving voltage Vf is higher than that of the ITO. However, when AZO or GZO is formed on a GaN film, the crystallinity thereof is higher than that of ITO since ZnO contained in AZO or GZO is epitaxially grown at the grain boundaries. Therefore, the use of AZO or GZO makes it possible to form a transparent conductive oxide film that is less peeled off and has higher strength characteristics, as compared to when ITO is used.

Preferably, the transparent conductive oxide film is formed of a material having a composition in the vicinity of a Sn concentration at which the lowest specific resistance is obtained. For example, if the transparent conductive oxide film is formed of ITO, it is preferable that the Sn concentration of ITO be in the range of 5 to 20% by mass. It is preferable to use ITO having a Sn concentration within the range of 7.5 to 12.5% by mass in order to further reduce the specific resistance.

Further, it is preferable that the thickness of the transparent conductive oxide film be in the range of 35 nm to 10000 nm (10 μm) in order to obtain low specific resistance and high transmittance. In addition, it is preferable that the thickness of the transparent conductive oxide film be less than or equal to 1000 nm (1 μm) in order to reduce manufacturing costs.

After the transparent conductive oxide film layer is formed, a thermal annealing process is performed at a temperature in the range of 200° C. to 900° C. to diffuse the dopants uniformly contained in the transparent conductive oxide film, thereby forming a highly doped region in the vicinity of the interface between the transparent conductive oxide film layer and the p-type semiconductor layer. In addition, the thermal annealing process can also improve the transmittance of the transparent conductive oxide film layer.

The dopants are diffused by the thermal annealing process performed at a temperature in the range of 200° C. to 900° C. However, in order to further reduce contact resistance, it is preferable that the thermal annealing process be performed at a temperature in the range of 300° C. to 600° C.

The annealing process may be performed in any gas atmosphere. However, in order to improve the transmittance, it is preferable that the annealing process be performed in an atmosphere including oxygen ($O_2$) gas. In addition, in order to lower the specific resistance of the transparent conductive oxide film, it is preferable that the annealing process be performed in an atmosphere including nitrogen ($N_2$) gas or hydrogen ($H_2$) gas.

Furthermore, a laser annealing process using an excimer laser may be performed to diffuse the dopants in the transparent conductive oxide film.

It is possible to reduce the contact resistance between the positive electrode 115 and the p-type GaN layer 114 by forming a highly doped region in the vicinity of the interface between the positive electrode 115 composed of the transparent conductive oxide film layer and the p-type GaN layer (p-type semiconductor layer) 114.

In the structure that reduces the contact resistance between the transparent conductive oxide film layer and the p-type semiconductor layer, it is considered that the dopant concentration at which the highest contact resistance is obtained is about 5 to 10% by mass higher than the dopant concentration at which the transparent conductive oxide film has the lowest specific resistance.

When the overall dopant concentration of the transparent conductive oxide film is increased in order to reduce the contact resistance, the specific resistance of the transparent conductive oxide film is increased, which results in an increase in the driving voltage Vf. However, as in this embodiment, when the dopant concentration of the transparent conductive oxide film is increased only in the vicinity of the interface, it is possible to reduce the contact resistance between the transparent conductive oxide film and the p-type semiconductor layer while maintaining low specific resistance of the transparent conductive oxide film.

Further, since the contact resistance between the transparent conductive oxide film layer and the p-type semiconductor layer is reduced by forming the highly doped region, it is not necessary to form a metal contact layer in the gallium nitride based compound semiconductor light-emitting device unlike the related art. As a result, it is possible to prevent a reduction in transmittance due to the metal contact layer and thus achieve a gallium nitride based compound semiconductor light-emitting device having high emission power.

It is preferable that the highly doped region be provided in the range of 0.1 nm to 20 nm from the interface between the transparent conductive oxide film layer and the p-type semiconductor layer. In addition, in order to further reduce the specific resistance of the transparent conductive oxide film, the highly doped region is preferably provided in the range of 0.1 nm to 10 nm, more preferably, in the range of 0.1 nm to 3 nm from the interface.

Furthermore, it is preferable that the transparent conductive oxide film layer have the highest dopant concentration at the interface between the transparent conductive oxide film layer and the p-type semiconductor layer.

A method of diffusing the dopants in the vicinity of the interface is not limited to the method of forming the transparent conductive oxide film layer, but any known method may be used to diffuse the dopants. For example, a sputtering method or a vapor deposition method may be used to form the transparent conductive oxide film layer.

Further, it is preferable that, before the transparent conductive oxide film forming the positive electrode 115 according to this embodiment is formed, a cleaning process be performed on the surface of the p-type GaN layer 114. The cleaning process performed before the transparent conductive oxide film is formed is considered to accelerate the diffusion of the dopants in the vicinity of the interface between the transparent conductive oxide film layer and the p-type GaN layer 114, but the mechanism thereof is not clearly defined.

For example, hydrogen fluoride (HF) or hydrochloric acid (HCl) may be used to clean the surface of the p-type GaN layer 114.

Furthermore, before the transparent conductive oxide film layer is formed, a layer having a dopant concentration that is higher than that of the transparent conductive oxide film is formed on the p-type GaN layer 114 as a transparent conductive oxide film contact layer (not shown). In this way, it is possible to form a highly doped region in the vicinity of the interface between the positive electrode 115 (transparent conductive oxide film layer) and the p-type GaN layer 114 (p-type semiconductor layer).

For example, when the transparent conductive oxide film layer is formed of ITO having 10% by mass of $SnO_2$, the transparent conductive oxide film contact layer may be formed of, for example, Sn (only the dopant), $SnO_2$ (dopant oxide), or ITO (15 to 20% by mass of $SnO_2$). When the transparent conductive oxide film layer is formed of AZO, the transparent conductive oxide film contact layer may be formed of Al, $Al_2O_3$, or AZO (Al-rich). When the transparent conductive oxide film layer is formed of IZO, the transparent conductive oxide film contact layer may be formed of Zn, ZnO, or IZO (Zn-rich). When the transparent conductive oxide film layer is formed of GZO, the transparent conductive oxide film contact layer may be formed of Ge, $Ge_2O_5$, or GZO (Ge-rich). As such, the material forming the transparent conductive oxide film contact layer may be appropriately selected depending on the material forming the transparent conductive oxide film layer.

In this embodiment, after the transparent conductive oxide film layer is formed, the transparent conductive oxide film contact layer is formed as an independent layer between the positive electrode 115 (transparent conductive oxide film layer) and the p-type GaN layer 114 (p-type semiconductor layer), but the invention is not limited thereto. For example, many highly doped regions may be provided in the transparent conductive oxide film layer.

Furthermore, since the transparent conductive oxide film contact layer is formed of the same material as that contained in the transparent conductive oxide film, the mutual diffusion therebetween easily occurs. In this case, even when a metallic material, such as Sn, is used, it is oxidized to have transmittance, which makes it possible to prevent a reduction in transmittance as in the metal contact layer.

When the transparent conductive oxide film contact layer is formed, it is possible to form the highly doped region without performing heat treatment, such as a thermal annealing process or a laser annealing process. However, the heat treatment, such as the thermal annealing process or the laser annealing process, makes it possible to form the highly doped region closer to the interface, and improve the transmittance of the transparent conductive oxide film. For this reason, it is preferable to perform the thermal annealing process or the laser annealing process in order to reduce the driving voltage Vf or improve the emission power of light.

The dopant concentration at the interface between the positive electrode 115 and the p-type GaN layer 114 can be measured by EDS in the cross-sectional TEM that has been well known to those skilled in the art. That is, EDS is performed at a plurality of points on the cross-sectional TEM in the vicinity of the interface between the positive electrode 115 and the p-type GaN layer 114, and it is possible to calculate the amount of dopant from a chart for each point. When the number of points is insufficient to measure the dopant concentration, the number of points may be increased.

The positive electrode bonding pad 116 is formed on the positive electrode 115 composed of the transparent conductive oxide film layer, and has various known structures made of, for example, Au, Al, Ni, and Cu. However, the material and the structure of the positive electrode bonding pad are not limited thereto.

It is preferable that the thickness of the positive electrode bonding pad 116 be in the range of 100 to 1000 nm. The bonding pad is characterized in that, as the thickness of the positive electrode bonding pad increases, the bondability thereof is improved. Therefore, it is more preferable that the thickness of the positive electrode bonding pad 116 be greater than or equal to 300 nm. In addition, it is most preferable that the thickness of the positive electrode bonding pad 116 be less than or equal to 500 nm in order to reduce manufacturing costs.

A negative electrode 17 is formed so as to come into contact with the n-type GaN layer 112 of the gallium nitride based compound semiconductor including the n-type GaN layer 112, the light-emitting layer 113, and the p-type GaN layer 114 sequentially formed on the substrate 111.

Therefore, when the negative electrode 117 is formed, the light-emitting layer 113 and the p-type GaN layer 114 are partially removed to expose the n-type GaN layer 112. Then, in this embodiment, the transparent positive electrode 115 is formed on the remaining p-type GaN layer 114, thereby forming the negative electrode 117 on the exposed n-type GaN layer 112.

The negative electrode 117 is formed of various materials whose compositions and structures have been known, and the present invention can use any of the known negative electrodes.

A known means is used to mount a transparent cover to the gallium nitride based compound semiconductor light-emitting device according to the above-described embodiment of the present invention, thereby forming a lamp. In addition, it is possible to form a white lamp by combining the gallium nitride based compound semiconductor light-emitting device according to this embodiment with a cover including a phosphor.

Figure 5:
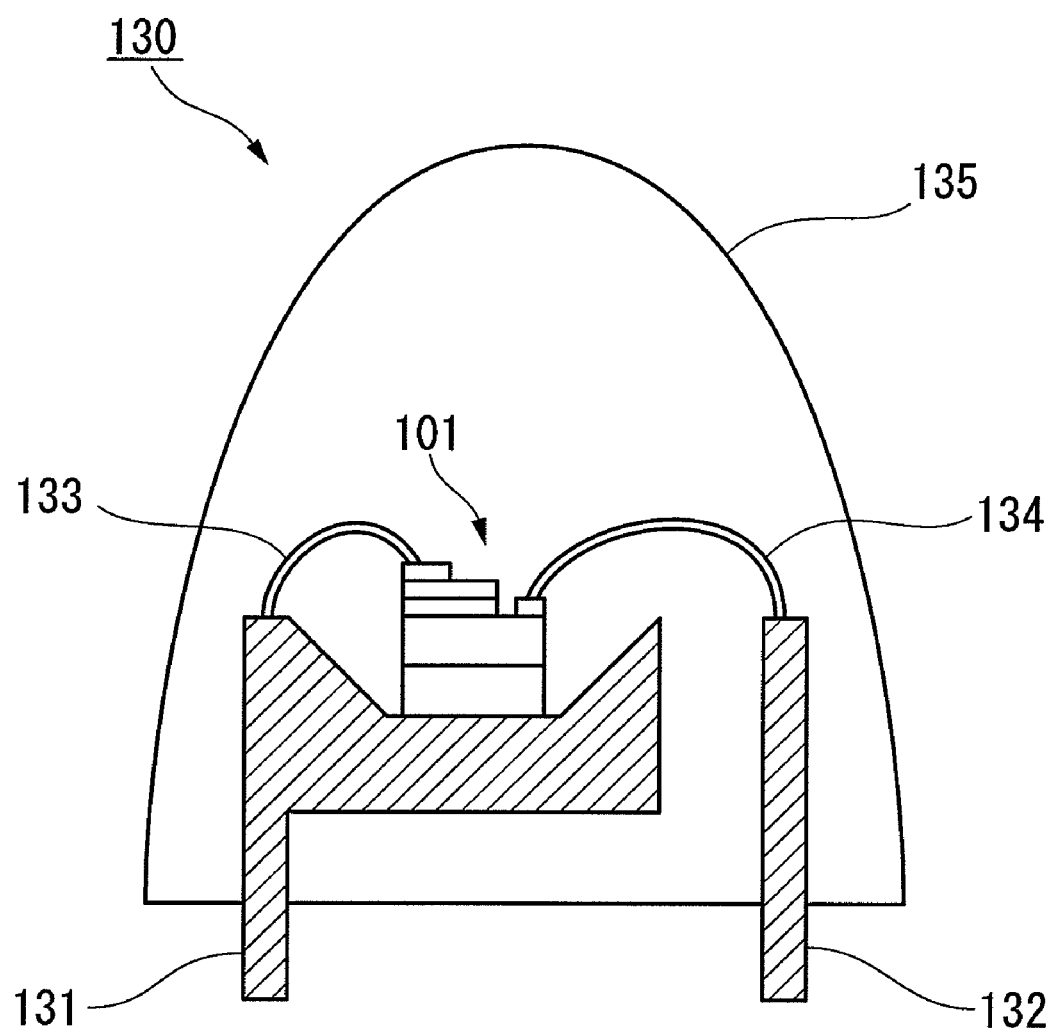
FIG. 5 is a diagram schematically illustrating a lamp including the gallium nitride based compound semiconductor light-emitting device according to the embodiment of the present invention.

As shown in FIG. 5, for example, the gallium nitride based compound semiconductor light-emitting device according to this embodiment may be used to form an LED lamp by a known method. The gallium nitride based compound semiconductor light-emitting device may be used for various types of lamps, such as a general-purpose bomb-shaped lamp, a side view type lamp for a backlight of a mobile phone, and a top view type lamp used for a display device. For example, when a face-up gallium nitride based compound semiconductor light-emitting device is mounted on the bomb-shaped lamp, as shown in FIG. 5, the gallium nitride based compound semiconductor light-emitting device 101 is adhered to one of two frames 131 and 132 by, for example, resin, and the positive electrode bonding pad and the negative electrode bonding pad are bonded to the frames 131 and 132 by wires 133 and 134 formed of, for example, gold, respectively. Then, the periphery of the device is molded by a transparent resin (see a mold 135 in FIG. 5), thereby manufacturing a bomb-shaped lamp 130.

The gallium nitride based compound semiconductor light-emitting device according to this embodiment has a low driving voltage Vf and high light emission efficiency. Therefore, it is possible to achieve a high-efficiency lamp.

Examples

Next, the invention will be described in more detail with reference to Examples, but the invention is not limited thereto.

Experimental Example 1

Figure 2:
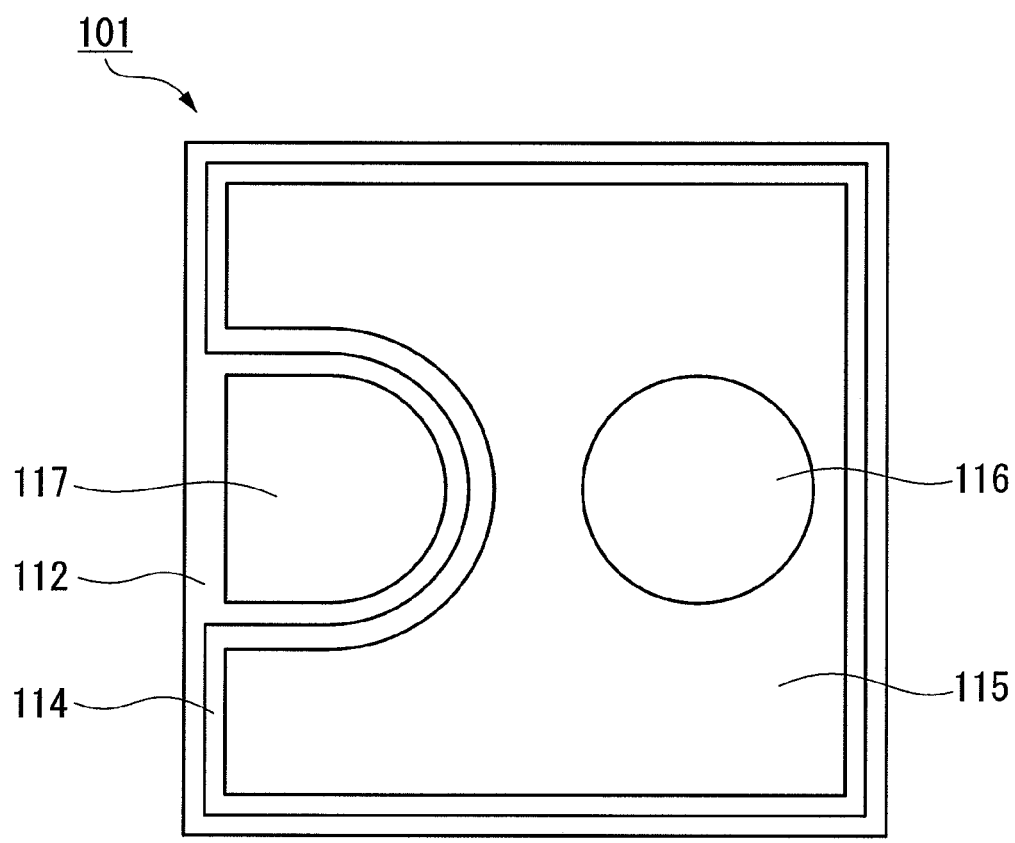
FIG. 2 is a plan view schematically illustrating the structure of the gallium nitride based compound semiconductor light-emitting device according to the embodiment of the present invention.

FIG. 3 is a cross-sectional view schematically illustrating an epitaxial structure used for the gallium nitride based compound semiconductor light-emitting device according to Examples of the invention. FIGS. 1 and 2 are respectively a cross-sectional view and a plan view schematically illustrating the gallium nitride based compound semiconductor light-emitting device according to the present invention. Next, the gallium nitride based compound semiconductor light-emitting device will be described with reference to FIGS. 1 to 3.

(Manufacture of Gallium Nitride Based Compound Semiconductor Light-emitting Device)

The laminated structure of the gallium nitride based compound semiconductor light-emitting device 120 was formed by sequentially laminating, on a c-plane (0001) sapphire substrate 121, an undoped GaN underlying layer (thickness=2 μm) 122, a Si-doped n-type GaN contact layer (thickness=2 μm, and carrier concentration=$1 \times 10^{19}$ cm$^{-3}$) 123, a Si-doped n-type $Al_{0.07}Ga_{0.93}N$ clad layer (thickness=12.5 nm, and carrier concentration=$1 \times 10^{18}$ cm$^{-3}$) 124, a light-emitting layer 125 having a multiple quantum structure of 6 Si-doped GaN barrier layers (thickness=14.0 nm, and carrier concentration=$1 \times 10^{18}$ cm$^{-3}$) and 5 undoped $In_{0.20}Ga_{0.80}N$ well layers (thickness=2.5 nm), a Mg-doped p-type $Al_{0.07}Ga_{0.93}N$ clad layer (thickness=10 nm) 126, and a Mg-doped p-type GaN contact layer (thickness=100 nm) 127, with a buffer layer (not shown) formed of AlN interposed therebetween. The layers 122 to 127 of the laminated structure of the gallium nitride based compound semiconductor light-emitting device 120 were grown by a general low pressure MOCVD device.

The epitaxial structure of the gallium nitride based compound semiconductor light-emitting device 120 was used to manufacture a gallium nitride based compound semiconductor light-emitting device (see FIG. 1). First, general dry etching was performed on a region for forming an n-type electrode to expose the surface of a Si-doped n-type GaN contact layer in only the region.

Then, HF and HCl were used to clean the surface of the p-type GaN contact layer 127, and a transparent conductive oxide film layer made of ITO was formed on only a region for forming a positive electrode on the p-type GaN contact layer 127 by a sputtering method. The ITO film was formed with a thickness of about 400 nm by a DC magnetron sputter. In the sputter, an ITO target having 10% by mass of $SnO_2$ was used, and the ITO film was formed at a pressure of about 0.3 Pa. After the transparent conductive oxide film made of ITO was formed, it was subjected to a thermal annealing process at a temperature of 600° C. for one minute. In this way, the positive electrode (see reference numeral 115 in FIGS. 1 and 2) according to the invention was formed on the p-type GaN contact layer 127.

The positive electrode formed by the above-mentioned method had high transmittance, for example, a transmittance of 90% or more in a wavelength range of 460 nm. The transmittance was measured by a spectrophotometer using a sample for measuring transmittance in which a transparent conductive oxide film layer having the same thickness as described above was laminated on a glass plate. In addition, the transmittance value was calculated in consideration of a transmittance value measured from only the glass plate.

Next, a first layer (thickness=40 nm) made of Cr, a second layer (thickness=100 nm) made of Ti, and a third layer (thickness=400 nm) made of Au were sequentially formed on a portion of the transparent conductive oxide film layer (positive electrode) and the Si-doped n-type GaN contact layer 123 by a vapor deposition method, thereby forming a positive electrode bonding pad and a negative electrode.

After forming the positive electrode bonding pad and the negative electrode, the rear surface of the sapphire substrate 111 was polished into a mirror surface by polishing particles, such as diamond particles. Then, the laminated structure was cut into individual square chips each having a 350 μm square, and the chip was mounted to the lead frame, and then connected to the lead frame by a gold (Au) wire.

(Measurement of Driving Voltage Vf)

A probe contacted the chip and a current of 20 mA was applied to the chip to measure a forward voltage (driving voltage: Vf). As a result, the forward voltage was 3.3 V. In addition, the emission power Po measured by a general integrating sphere was 10 mW, and it was found that light was emitted from the entire surface of the positive electrode 115.

(Calculation of Sn Concentration)

Figure 4:
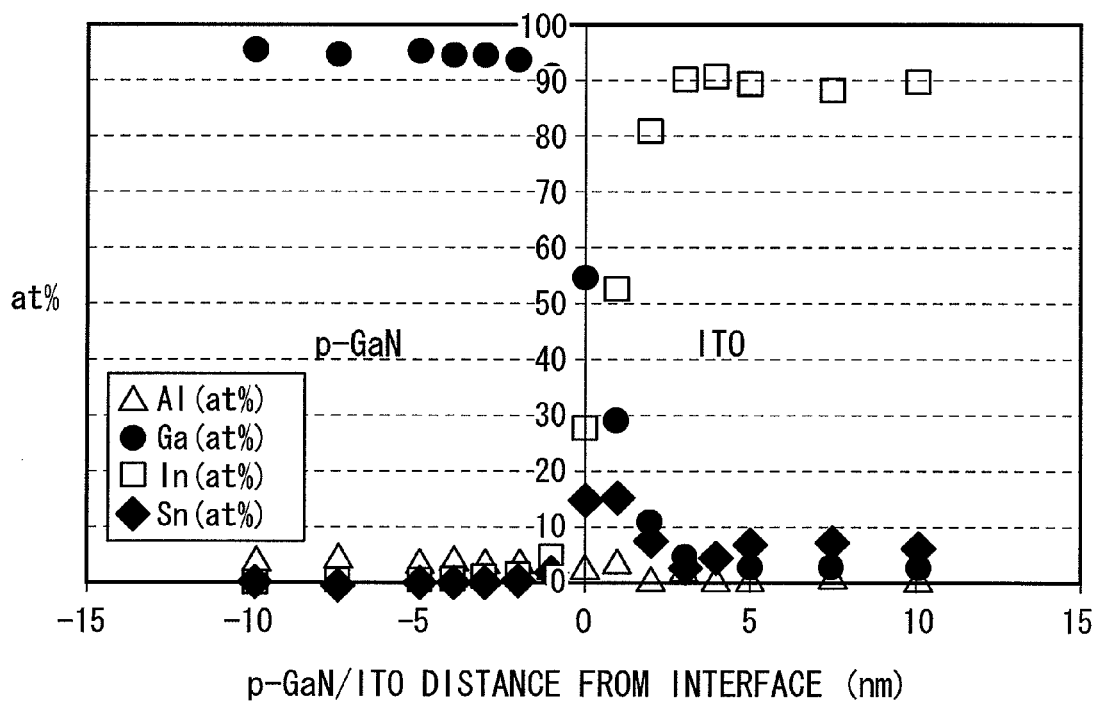
FIG. 4 is a graph illustrating Sn concentration values in regions distant from the center of the interface between a p-type GaN contact layer and a transparent conductive oxide film layer in the gallium nitride based compound semiconductor light-emitting device according to the embodiment of the present invention.

A Sn concentration was estimated by EDX analysis of the cross-sectional TEM in a region having a width of 20 nm from the center of the interface between the p-type GaN contact layer 127 and the transparent conductive oxide film layer (positive electrode), and the result was shown in FIG. 4. The Sn concentration was defined by the ratio (at %) of metal atoms (In+Sn+Ga+Al) that was considered to exist in the vicinity of the interface. The Sn concentration of the transparent conductive oxide film was in the range of 5 to 10 at % in the region that is 2 nm or more away from the interface, and the Sn concentration was about 15 at % in the region that is 2 nm or less away from the interface.

Experimental Examples 2 to 5

Before a transparent conductive oxide film layer made of ITO was formed, a transparent conductive oxide film contact layer with a thickness of about 2 nm was formed, and a gallium nitride based compound semiconductor light-emitting device was manufactured, similar to Experimental example 1.

Experimental Example 6

Similar to Experimental example 1, a transparent conductive oxide film made of ITO was formed, and a KrF (248 nm) excimer laser was used to perform a laser annealing process on the film. The laser annealing process was performed under the conditions of an emission area of 3×3 mm, an energy of 10 mJ, and a frequency of 200 Hz at one shot.

Experimental Example 7

A transparent conductive oxide film made of ITO was formed by a vapor deposition method, and the same gallium nitride based compound semiconductor light-emitting device as that in Experimental example 1 was manufactured.

Experimental Example 8

A transparent conductive oxide film layer was formed of AZO having 10% by mass of $Al_2O_3$ by a sputtering method, and the same gallium nitride based compound semiconductor light-emitting device as that in Experimental example 1 was manufactured.

(Evaluation of Close Adhesion)

In order to evaluate the close adhesion of ITO and AZO, an ITO film and an AZO film were formed on a sapphire substrate under the same conditions as those in Experimental examples 1 and 8, and were subjected to a heat treatment. Then, a peeling test was performed on the films. As the peeling test, an acceleration test, which is a combination of a method (JIS H8062-1992) defined by JIS and a heat sink test, was adopted.

First, a cutter knife was used to form linear scratches on the ITO film and the AZO film in a lattice shape at intervals of 1 mm. The scratches were formed to reach the surface of the sapphire substrate. Then, the samples were heated in an oven at a temperature of 400° C. for 30 minutes, rapidly cooled down in the water at a temperature of 20° C., and then dried. These heating and cooling processes were repeated five times.

Then, an adhesive tape (manufactured by Nichiban Co., Ltd: a cellophane adhesive tape with a width of 12 mm) was closely adhered to the surface of the film having the scratches formed therein, and the tape was peeled off from the surface of the film. Then, among 1 mm by 1 mm 100 lattices defined by the scratches formed on the surface of the film, the number of remaining lattices that were not peed off was counted. That is, when 100 lattices are not peeled off, it can be determined that no film is peeled off.

Experimental Examples 9 and 10

A gallium nitride based compound semiconductor light-emitting device was manufactured, similar to Experimental example 1, except that the annealing process was performed at the temperature shown in Table 1.

Experimental Examples 11 and 12

A gallium nitride based compound semiconductor light-emitting device was manufactured, similar to Experimental example 1, except that a transparent conductive film was formed with the thickness shown in Table 1.

Experimental Example 13

A gallium nitride based compound semiconductor light-emitting device was manufactured, similar to Experimental example 1, except that the thermal annealing process at a temperature of 600° C. was not performed.

Experimental Example 14

A gallium nitride based compound semiconductor light-emitting device was manufactured, similar to Experimental example 1, except that the cleaning process was not performed before a transparent conductive oxide film was formed.

Experimental Example 15

A Pt target was used to form a transparent conductive oxide film contact layer with a thickness of about 0.5 nm, and a gallium nitride based compound semiconductor light-emitting device was manufactured, similar to Experimental example 1.

Experimental Example 16

A gallium nitride based compound semiconductor light-emitting device was manufactured using an AZO transparent conductive oxide film layer, similar to Experimental example 8, except that the thermal annealing process at a temperature of 600° C. was not performed.

Experimental Examples 17 and 18

A gallium nitride based compound semiconductor light-emitting device was manufactured, similar to Experimental example 1, except that the annealing process was performed at the temperature shown in Table 1.

Experimental Examples 19 and 20

A gallium nitride based compound semiconductor light-emitting device was manufactured, similar to Experimental example 1, except that a transparent conductive film was formed with the thickness shown in Table 1.

Table 1 shows the formation conditions of the positive electrodes according to Experimental examples 1 to 20 and device characteristics. In addition, Table 1 shows Sn concentrations at positions that are 0, 1, 2, 5, and 10 nm away from the interface between the p-type GaN contact layer and the transparent conductive oxide film layer to the transparent conductive oxide film layer.

TABLE 1

| | Deposition conditions | | | | | | |
|---|---|---|---|---|---|---|---|
| | Cleaning before deposition | Deposition method | Contact layer | Thickness of contact layer | Transparent conductive film | Thickness of Transparent conductive film (nm) | Annealing after deposition of electrode |
| Experimental example 1 | HF, HCl | Sputtering | | | ITO | 400 | 600° C., one minute |
| Experimental example 2 | HF, HCl | Sputtering | Sn | 2 nm | ITO | 400 | Nothing |
| Experimental example 3 | HF, HCl | Sputtering | Sn | 2 nm | ITO | 400 | 600° C., one minute |
| Experimental example 4 | HF, HCl | Sputtering | $SnO_2$ | 2 nm | ITO | 400 | 600° C., one minute |
| Experimental example 5 | HF, HCl | Sputtering | ITO ($SnO_2$: 20% by mass) | 2 nm | ITO | 400 | 600° C., one minute |
| Experimental example 6 | HF, HCl | Sputtering | | | ITO | 400 | Laser annealing |
| Experimental example 7 | HF, HCl | Vapor deposition | | | ITO | 400 | 600° C., one minute |
| Experimental example 8 | HF, HCl | Sputtering | | | AZO | 400 | 600° C., one minute |
| Experimental example 9 | HF, HCl | Sputtering | | | ITO | 400 | 800° C., one minute |

TABLE 1-continued

| | | | | | | | |
|---|---|---|---|---|---|---|---|
| Experimental example 10 | HF, HCl | Sputtering | | | ITO | 400 | 250° C., one minute |
| Experimental example 11 | HF, HCl | Sputtering | | | ITO | 900 | 600° C., one minute |
| Experimental example 12 | HF, HCl | Sputtering | | | ITO | 60 | 600° C., one minute |
| Experimental example 13 | HF, HCl | Sputtering | | | ITO | 400 | Nothing |
| Experimental example 14 | Nothing | Sputtering | | | ITO | 400 | 600° C., one minute |
| Experimental example 15 | HF, HCl | Sputtering | Pt | 0.5 nm | ITO | 400 | 600° C., one minute |
| Experimental example 16 | HF, HCl | Sputtering | | | AZO | 400 | Nothing |
| Experimental example 17 | HF, HCl | Sputtering | | | ITO | 400 | 1000° C., one minute |
| Experimental example 18 | HF, HCl | Sputtering | | | ITO | 400 | 200° C., one minute |
| Experimental example 19 | HF, HCl | Sputtering | | | ITO | 1200 | 600° C., one minute |
| Experimental example 20 | HF, HCl | Sputtering | | | ITO | 30 | 600° C., one minute |

| | Device characteristics | | Dopant concentration/% | | | | | |
|---|---|---|---|---|---|---|---|---|
| | Vf/V | Po/mW | 0 nm from interface | 1 nm from interface | 2 nm from interface | 3 nm from interface | 5 nm from interface | 10 nm from interface |
| Experimental example 1 | 3.3 | 10 | 15 | 15 | 8 | 10 | 7 | 6 |
| Experimental example 2 | 3.3 | 10 | 18 | 17 | 10 | 9 | 8 | 8 |
| Experimental example 3 | 3.2 | 10 | 20 | 13 | 7 | 10 | 6 | 8 |
| Experimental example 4 | 3.2 | 10 | 17 | 12 | 9 | 11 | 9 | 8 |
| Experimental example 5 | 3.2 | 10 | 19 | 12 | 11 | 12 | 9 | 10 |
| Experimental example 6 | 3.3 | 10 | 19 | 20 | 13 | 14 | 12 | 11 |
| Experimental example 7 | 3.3 | 10 | 15 | 17 | 12 | 11 | 9 | 7 |
| Experimental example 8 | 3.5 | 10 | 16 | 16 | 8 | 9 | 7 | 7 |
| Experimental example 9 | 3.3 | 10 | 21 | 18 | 17 | 14 | 10 | 11 |
| Experimental example 10 | 3.4 | 10 | 14 | 13 | 11 | 10 | 8 | 7 |
| Experimental example 11 | 3.2 | 9 | 18 | 14 | 12 | 9 | 10 | 8 |
| Experimental example 12 | 3.5 | 10 | 17 | 14 | 12 | 10 | 8 | 7 |
| Experimental example 13 | 3.6 | 10 | 11 | 8 | 10 | 9 | 10 | 9 |
| Experimental example 14 | 3.6 | 10 | 13 | 14 | 10 | 10 | 8 | 10 |
| Experimental example 15 | 3.3 | 7 | 3 | 6 | 8 | 8 | 8 | 8 |
| Experimental example 16 | 3.7 | 10 | 11 | 10 | 8 | 10 | 10 | 10 |
| Experimental example 17 | 3.6 | 10 | 18 | 16 | 14 | 10 | 9 | 10 |
| Experimental example 18 | 3.6 | 10 | 12 | 10 | 11 | 10 | 9 | 10 |
| Experimental example 19 | 3.2 | 8 | 18 | 16 | 15 | 14 | 10 | 9 |
| Experimental example 20 | 3.7 | 10 | 16 | 14 | 16 | 13 | 10 | 11 |

According to the evaluation results of the device characteristics shown in Table 1, in the chips subjected to the thermal annealing process at a temperature of 600° C., the Sn concentration is high at the position that is 2 nm or less away from the interface between the p-type GaN layer and the ITO layer, and the driving voltage Vf is reduced (for example, Experimental example 1).

In addition, when the thermal annealing temperature is 800° C. (Experimental example 9) or 250° C. (Experimental example 10), the Sn concentration is high at the position that is 2 nm or less away from the interface, and the driving voltage Vf is reduced.

Further, when the thickness of the transparent conductive oxide film is 900 nm (Experimental example 11) or 60 nm (Experimental example 12), the Sn concentration is high at the position that is 2 nm or less away from the interface, and the driving voltage Vf is reduced.

Further, in the chips not subjected to the thermal annealing process, it is possible to form a region having a high Sn concentration by forming a Sn contact layer before an ITO layer is formed. Therefore, the driving voltage Vf is reduced (Experimental example 2).

In the chip having a Sn contact layer formed therein and subjected to the thermal annealing process, a region having a high Sn concentration exists at a position closer to the interface. Therefore, the driving voltage Vf is further reduced (Experimental examples 3 to 5).

In addition, the region having a high Sn concentration also exists in the chip subjected to a laser annealing process instead of the thermal annealing process at a temperature of 600° C. (Experimental example 6) or the chip having an ITO film formed by a vapor deposition method (Experimental example 7).

When an AZO film is formed as the transparent conductive oxide film (Experimental example 8), the driving voltage Vf is higher than that when an ITO film is formed. However, like the ITO film, a region that is highly doped with Al is formed by the thermal annealing process at a temperature of 600° C., and the driving voltage Vf is reduced. During the peeling test, when the ITO film is peeled off, about 70 lattices remain. However, when the AZO film is peeled off, 100 lattices all remain. As a result, the AZO film requires a higher driving voltage Vf than the ITO film, but has higher adhesion than the ITO film.

In Experimental example 13 in which the thermal annealing process was not performed after the transparent conductive oxide film is formed, no region having a high Sn concentration existed up to 10 nm away from the interface between the p-type GaN layer and the ITO layer. In Experimental example 13, the driving voltage Vf of the light-emitting device was 3.6 V.

In Experimental example 14 in which the p-type GaN layer was not cleaned before the transparent conductive oxide film was formed, a region having a high Sn concentration existed up to 1 nm away from the interface between the p-type GaN layer and the ITO layer. In Experimental example 14, the driving voltage Vf of the light-emitting device was 3.6 V.

In Experimental example 15 in which a Pt target was used to form the transparent conductive oxide film contact layer with a thickness of about 0.5 nm, the dopant concentration was 3% at the interface. In Experimental example 15, the emission power Po of the light-emitting device was 7 mW.

In Experimental example 16 in which the transparent conductive oxide film was formed of AZO and the thermal annealing process at a temperature of 600° C. was not performed, no region having a high Sn concentration existed up to 10 nm away from the interface between the p-type GaN layer and the ITO layer. In Experimental example 16, the driving voltage Vf of the light-emitting device was 3.7 V.

In Experimental example 17 in which, after the transparent conductive oxide film was formed, the thermal annealing temperature process was performed at a temperature of 1000° C., the segregation of the Sn concentration was accelerated up to 2 nm away from the interface. In Experimental example 17, the driving voltage Vf of the light-emitting device was 3.6 V.

In Experimental example 18 in which, after the transparent conductive oxide film was formed, the thermal annealing process was performed at a temperature of 200° C., no region having a high Sn concentration existed is up to 10 nm away from the interface between the p-type GaN layer and the ITO layer. In Experimental example 18, the driving voltage Vf of the light-emitting device was 3.6 V.

In Experimental example 19 in which the transparent conductive oxide film was formed with a large thickness of 1200 nm, the segregation of the Sn concentration was accelerated up to 2 nm away from the interface. In Experimental example 19, the emission power Po of the light-emitting device was 8 mW.

In Experimental example 20 in which the transparent conductive oxide film was formed with a small thickness of 30 nm, the segregation of the Sn concentration was accelerated up to 2 nm away from the interface. In Experimental example 20, the driving voltage Vf of the light-emitting device was 3.7 V.

The above-mentioned results proved that the gallium nitride based compound semiconductor light-emitting device according to the invention had high light emission efficiency, a low driving voltage Vf, and high device characteristics.

Second Embodiment

Next, a gallium nitride based compound semiconductor light-emitting device according to a second embodiment of the invention will be described with reference to FIGS. 6 to 9. The second embodiment differs from the first embodiment in that convex and concave portions are provided, but the other components are the same as those in the first embodiment. The convex and concave portions will be mainly described in this embodiment.

[Overall Structure of Gallium Nitride Based Compound Semiconductor Light-emitting Device]

Figure 6:
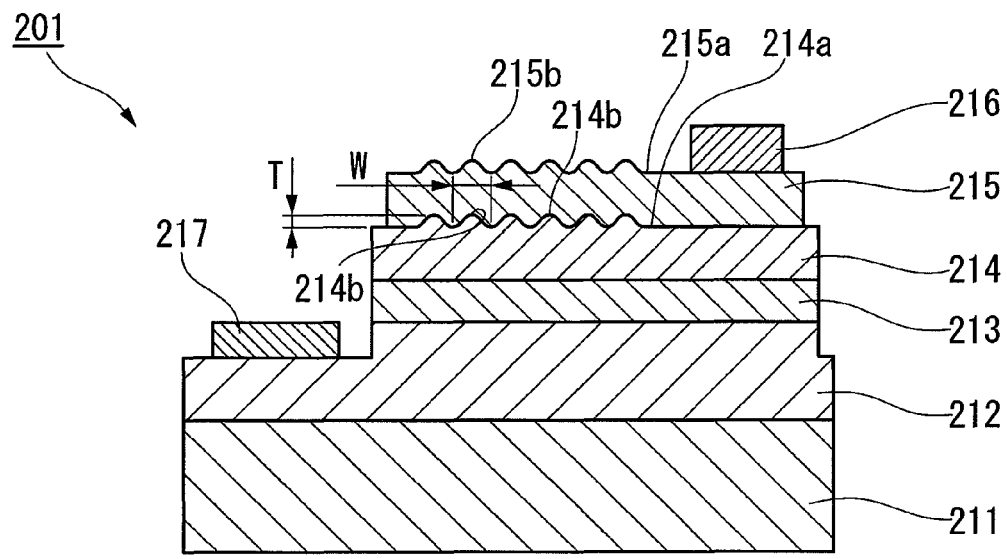
FIG. 6 is a cross-sectional view schematically illustrating the structure of a gallium nitride based compound semiconductor light-emitting device according to another embodiment of the present invention.

As shown in FIG. 6, a gallium nitride based compound semiconductor light-emitting device 201 according to this embodiment has a schematic structure in which an n-type GaN layer 212, a light-emitting layer 213, and a p-type GaN layer (p-type semiconductor layer) 214 are laminated on a substrate 211 in this order to form a gallium nitride based compound semiconductor device, an uneven surface is formed on at least a portion of the p-type GaN layer 214 of the gallium nitride based compound semiconductor device, a positive electrode 215 composed of a transparent conductive oxide film including dopants is formed on the p-type GaN layer 214, and the dopant concentration of an interface between the p-type GaN layer 214 and the positive electrode (transparent conductive oxide film) 215 is higher than the bulk dopant concentration of the transparent conductive oxide film forming the positive electrode 215.

In addition, in the example shown in FIG. 6, a random pattern of convex portions 214b forming the uneven surface is formed on a surface 214a of the p-type GaN layer 214, and a surface 215a of the positive electrode 215 formed on the p-type GaN layer 214 has an uneven surface including convex portions 215b corresponding to the convex portions 214b of the p-type GaN layer 214.

As shown in FIG. 6, an uneven pattern, that is, an uneven surface is formed on at least a portion of the surface 214a of the p-type GaN layer 214. In the example shown in FIG. 6, a convex pattern composed of a plurality of convex portions 214b having periodicity is formed on the surface 214a of the p-type GaN layer 214 substantially at the center of the gallium nitride based compound semiconductor light-emitting device 201 in the horizontal direction.

As a method of forming the uneven pattern on the surface 214a of the p-type GaN layer 214, a known photolithography method may be used.

The uneven pattern formed on the surface 214a is not limited to the pattern having periodicity shown in FIG. 6. For example, a pattern in which the convex portions have different sizes or a pattern in which the convex portions are arranged at irregular intervals may be used.

The shape of the convex portion 214b is not particularly limited. For example, the convex portion 214b may be formed in various shapes including a cylinder, a polygonal prism, such as a triangular prism or a square pillar, a cone, or a polygonal pyramid, such as a triangular pyramid or a quadrangular pyramid. In addition, in the cross-sectional view shown in FIG. 6, it is preferable that the dimension W (width) of the bottom of the convex portion 214b be greater than or equal to that of the top thereof. In FIG. 6, the convex portion 214b is configured to be tapered from the bottom to the top.

The size of the convex portion 214b is not particularly limited. For example, preferably, the width W of the bottom is in the range of 0.01 μm to 3 μm. This range of the width W of the bottom makes it possible to effectively improve light emission efficiency.

A lithography technique can be used to form the convex portion 14b such that the width W of the bottom of the convex portion 214b is smaller than 0.01 μm. However, in this case, this process costs a great deal and the size of the convex portion is too small to obtain sufficiently high emission efficiency.

In general, the size of the gallium nitride based compound semiconductor light-emitting device is in the range of 100 μm to 2000 μm. Therefore, when the width W of the bottom of the convex portion 214b is larger than 3 μm, the surface area of the convex portion 214b in a unit area decreases, which makes it difficult to obtain sufficiently high emission efficiency. It is more preferable that the width W of the bottom of the convex portion 214b be in the range of 0.02 μm to 2 μm.

The distance between the convex portions 214b is not particularly limited as long as the convex portions 214b are arranged in a periodic pattern. It is preferable that the distance between the peaks of the convex portions be in the range of 0.01 μm to 3 μm.

A lithography technique can be used to form the convex portion 214b such that the distance between the convex portions 214b is smaller than 0.01 μm. However, in this case, this process costs a great deal, and the pattern is too dense. As a result, there is a concern that light emission efficiency will be lowered.

Further, as described above, generally, the size of the light-emitting device is in the range of 100 μm to 2000 μm. When the distance between the convex portions 214b is larger than 3 μm, the surface area of the convex portion 214b in a unit area decreases, and it is difficult to obtain sufficiently high light emission efficiency. Therefore, it is more preferable that the distance between the concave portions be in the range of 0.02 nm to 2 nm.

The height T of the convex portion 214b is not particularly limited, but it is preferable that the height T of the convex portion 214b be in the range of 0.1 μm to 2.0 μm.

When the height T of the convex portion 214b is smaller than 0.1 μm, the height of the convex portion is too small to obtain sufficiently high light emission efficiency. On the other hand, when the height of the convex portion 214b is larger than 2.0 μm, the light emission efficiency is improved, but productivity is significantly reduced, which is not preferable.

Therefore, it is more preferable that the convex portion 214b be formed such that the relationship between the width W of the bottom and the height T satisfies W<T. When the above-mentioned relationship is satisfied, it is possible to more effectively improve the light emission efficiency of the gallium nitride based compound semiconductor light-emitting device.

The positive electrode 215 is composed of the transparent conductive oxide film layer that comes into contact with at least the p-type semiconductor layer (p-type GaN layer 214). A positive electrode bonding pad 216 for electrical connection to, for example, a circuit board or a lead frame is provided on a portion of the transparent conductive oxide film layer.

In the example shown in FIG. 6, the surface 215a of the positive electrode 215 is composed of an uneven surface having the convex portions 215b corresponding to the convex portions 214b formed on the surface of the p-type GaN layer 214.

[Method of Forming Uneven Pattern in Gallium Nitride Based Compound Semiconductor Light-emitting Device]

In this embodiment of the invention, a region on the p-type GaN layer in which the uneven pattern is formed can be provided by forming a mask made of metal particles on the surface of the p-type GaN layer including the region and performing dry etching on the p-type GaN layer using the mask.

The uneven pattern can be formed on the surface of the p-type GaN layer by a method of manufacturing a gallium nitride based compound semiconductor light-emitting device including, for example, the following processes (1) to (3):

(1) a process of sequentially laminating on a substrate an n-type semiconductor layer, a light-emitting layer, and a p-type semiconductor layer each composed of a gallium nitride based compound semiconductor;

(2) a process of forming a mask made of metal particles on the p-type semiconductor layer; and (3) a process of performing dry etching on the p-type semiconductor layer using the mask.

Next, the processes (1) to (3) will be described.

<Process (1)>

First, an n-type semiconductor layer, a light-emitting layer, and a p-type semiconductor layer, each composed of a gallium nitride based compound semiconductor, are laminated on a substrate in this order. As described above, any of the materials and the methods according to the related art may be used to form the laminated structure of the gallium nitride based compound semiconductors.

<Process (2)>

Then, a metal thin film made of metal particles is formed on the p-type GaN layer of the laminated structure of the gallium nitride based compound semiconductors. The metal thin film may be formed by a general vapor deposition apparatus.

It is preferable that the thickness of the metal thin film be in the range of 50 Å to 1000 Å in consideration of the formation of a mask in the next process.

The metal thin film may be formed by, for example, a sputtering apparatus, instead of the vapor deposition apparatus, as long as the metal thin film can be formed with a uniform thickness within the above-mentioned range.

The metal particles used for the metal thin film (metal particle mask) may be composed of fine particles having spherical shapes and high cohesion. For example, Ni particles or Ni alloy particles may be used as the metal particles. In addition, metal particle materials having high cohesion and capable of improving process efficiency may be a metal with a low melting pointlic materials or alloys with a low melting point that contain at least one of Ni, Au, Sn, Ge, Pb, Sb, Bi, Cd, and In and have a melting point in the range of 100° C. to 450° C. It is preferable to use an AuSn alloy, an AuGe alloy, an AuSnNi alloy, and an AuGeNi alloy among these metallic materials, and it is more preferable to use the AuSn alloy.

It has been found that the AuSn alloy is eutectic at a temperature in the range of about 190 to 420° C. when a Sn composition ratio is in the range of about 10 to 35% by mass. In addition, it has been found that the alloy layer is generally in a cohesive state beyond the temperature range.

Next, a heat treatment is performed on the metal thin film in order to obtain the metal particle mask from the metal thin film.

The heat treatment temperature of the metal thin film depends on the kind of metallic material used. It is preferable that the heat treatment be performed at a temperature in the range of 100 to 600° C. for one minute. When the heat treatment is performed on the metal thin film under these conditions, it is possible to obtain the metal particle mask formed on the p-type GaN layer.

The shape of the metal particle mask after the heat treatment is changed by the concentration of oxygen in the heat treatment atmosphere.

Therefore, it is possible to form a metal particle mask having a shape suitable for improving light emission efficiency by controlling the concentration of oxygen in the heat treatment atmosphere in correspondence with the kind of metallic material used. In addition, it is more preferable to perform the heat treatment in an atmosphere containing no oxygen according to the kind of metallic material, in order to form a good mask shape.

It is preferable that the density of fine particles in the metal particle mask be in the range of $1\times10^5$ particles/mm$^2$ to $1\times10^8$ particles/mm$^2$. This density range makes it possible to effectively improve light emission efficiency. It is more preferable that the density be in the range of $1\times10^6$ particles/mm$^2$ to $1\times10^7$ particles/mm$^2$.

In this embodiment, since the shape of the uneven pattern formed on the p-type GaN layer is defined by the shape of the metal particle mask, it is possible to control the shape of the uneven pattern by controlling the shape of the metal particle mask.

In particular, the shape of the uneven pattern on the surface of the p-type GaN layer is greatly affected by the thickness of the metal particle mask.

It is preferable that the thickness of the metal particle mask before the heat treatment be in the range of 0.005 μm to 1 μm. The optimum value of the thickness of the metal particle mask depends on the quality of a material forming the metal particle mask or the quality of a sealing resin used when the gallium nitride based compound semiconductor light-emitting device according to this embodiment forms a lamp. However, when the thickness of the metal particle mask is smaller than 0.005 μm, the metal particle mask cannot serve as a mask, and it is difficult to form the uneven pattern capable of effectively emitting light on the p-type GaN layer. On the other hand, when the thickness of the metal particle mask is larger than 1 μm, a cohesion effect is deteriorated, and it is difficult to form the uneven pattern capable of effectively emitting light on the p-type GaN layer, as described above.

<Process (3)>

Next, dry etching is performed on the p-type GaN layer using the metal particle mask to form a specific uneven pattern on the surface of the p-type GaN layer.

As the dry etching, general reactive ion etching (RIE) may be used. In addition, the kind of gas used for dry etching is not particularly limited. However, it is preferable to perform etching using gas including chlorine.

In order to prevent a change in metallic cohesion shape (metal particle shape), it is preferable that the temperature of the substrate be maintained at 100° C. or less.

In this embodiment, dry etching is performed to form the uneven pattern on the surface of the p-type GaN layer, but the invention is not limited thereto. For example, wet etching may be used.

A transparent cover is provided to the gallium nitride based compound semiconductor light-emitting device according to this embodiment to form a lamp by, for example, a known means. In addition, it is possible to form a white lamp by combining the gallium nitride based compound semiconductor light-emitting device according to this embodiment with a cover including a phosphor.

Figure 9:
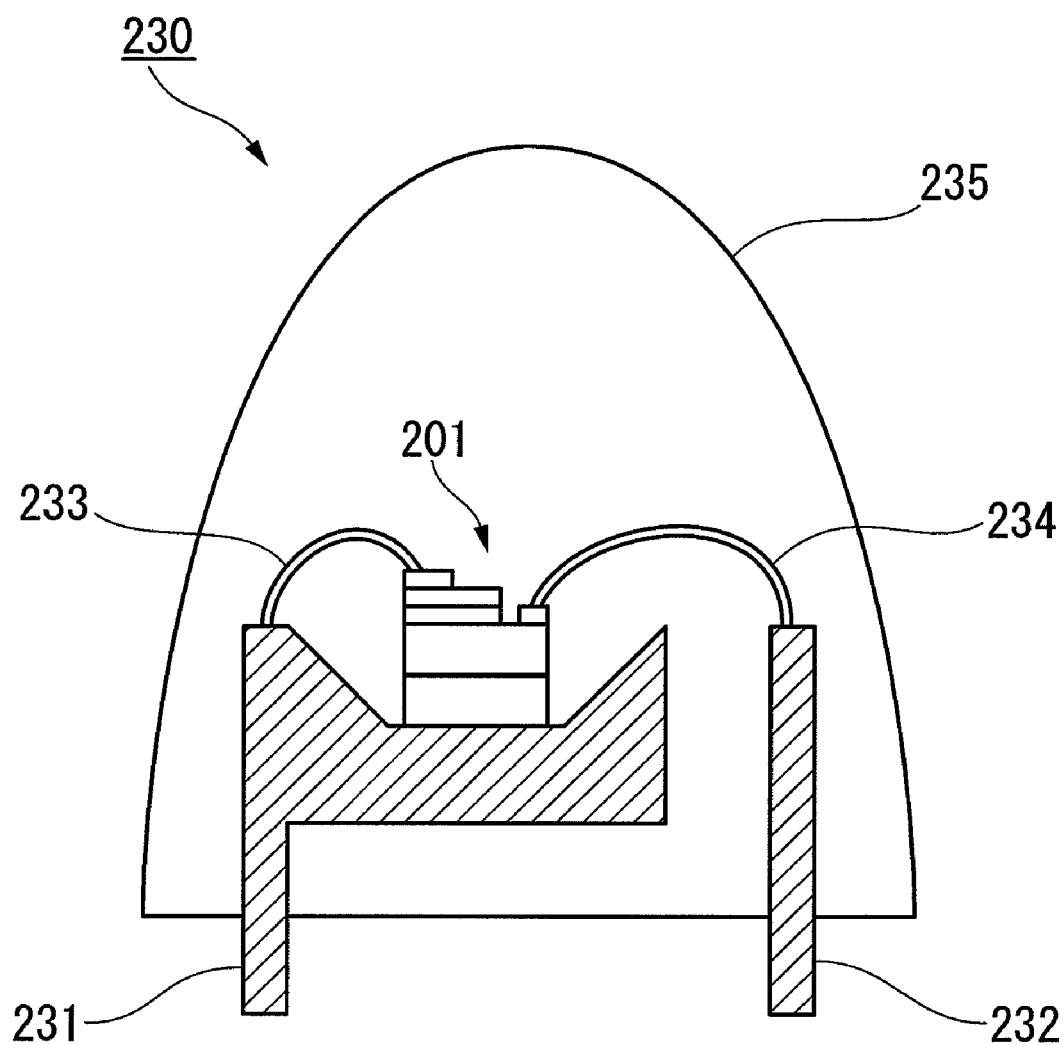
FIG. 9 is a diagram schematically illustrating a lamp including the gallium nitride based compound semiconductor light-emitting device according to the embodiment of the present invention.

For example, as shown in FIG. 9, the gallium nitride based compound semiconductor light-emitting device according to this embodiment may be used to form an LED lamp by any known method. The gallium nitride based compound semiconductor light-emitting device may be used for various types of lamps, such as a general-purpose bomb-shaped lamp, a side view type lamp for a backlight of a mobile phone, and a top view type lamp used for a display device. For example, when a face-up gallium nitride based compound semiconductor light-emitting device is mounted to the bomb-shaped lamp, as shown in FIG. 9, the gallium nitride based compound semiconductor light-emitting device 1 is adhered to one of two frames 231 and 232 by, for example, resin, and the positive electrode bonding pad and the negative electrode bonding pad are bonded to the frames 231 and 232 by wires 233 and 234 formed of, for example, gold, respectively. Then, the periphery of the device is molded by a transparent resin (see a mold 235 in FIG. 9), thereby manufacturing a bomb-shaped lamp 230.

The gallium nitride based compound semiconductor light-emitting device according to this embodiment has a low driving voltage Vf and high light emission efficiency. Therefore, it is possible to achieve a high-efficiency lamp.

Examples

Next, the invention will be described in more detail with reference to Examples, but the invention is not limited thereto.

Experimental Example 21

Figure 7:
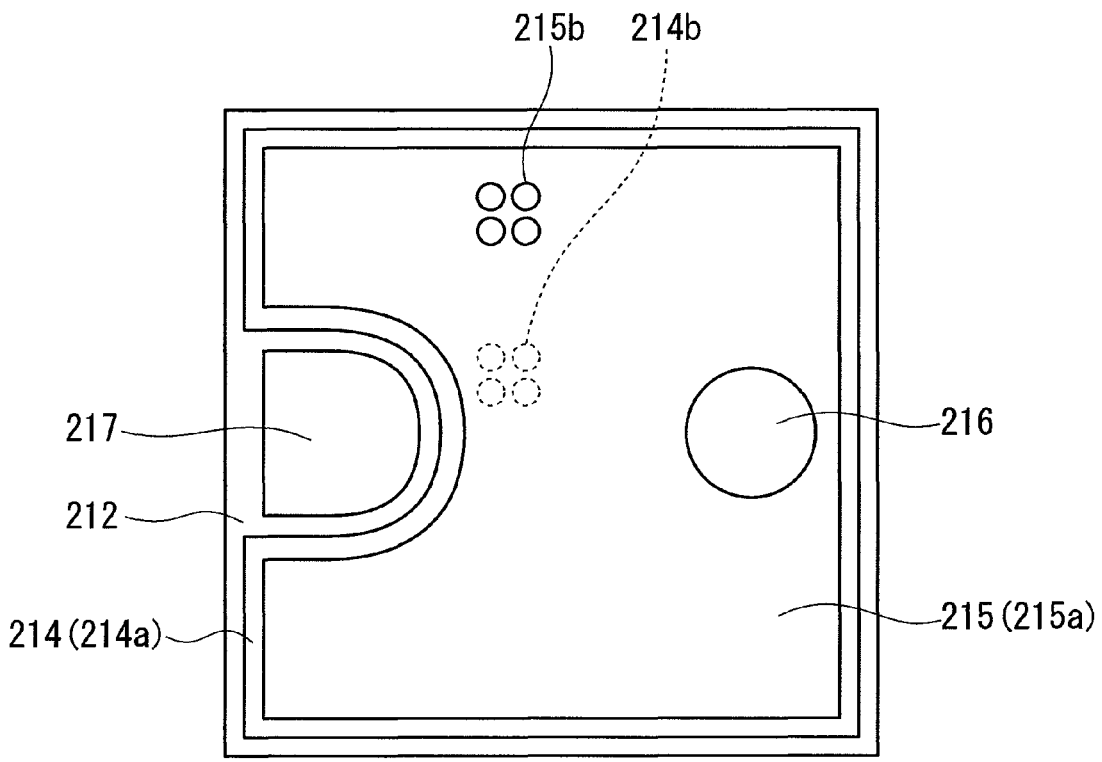
FIG. 7 is a plan view schematically illustrating the structure of the gallium nitride based compound semiconductor light-emitting device according to the embodiment of the present invention.
Figure 8:
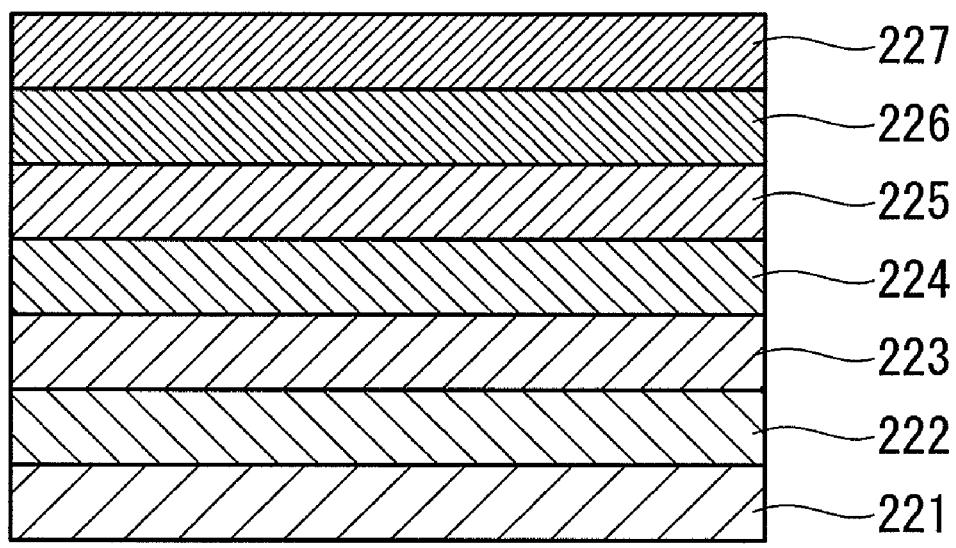
FIG. 8 is a cross-sectional view schematically illustrating a laminated structure of gallium nitride based compound semiconductors in the gallium nitride based compound semiconductor light-emitting device according to the embodiment of the present invention.

FIG. 8 is a cross-sectional view schematically illustrating an epitaxial structure used for the gallium nitride based compound semiconductor light-emitting device according to Examples of the invention. FIGS. 6 and 7 are a cross-sectional view and a plan view schematically illustrating the gallium nitride based compound semiconductor light-emitting device according to the invention, respectively. Next, the gallium nitride based compound semiconductor light-emitting device will be described with reference to FIGS. 6 to 8.

(Manufacture of Gallium Nitride Based Compound Semiconductor Light-emitting Device)

The laminated structure of the gallium nitride based compound semiconductor light-emitting device 220 was formed by sequentially laminating, on a c-plane (0001) sapphire substrate 221, an undoped GaN underlying layer (thickness=2 μm) 222, a Si-doped n-type GaN contact layer (thickness=2 μm, and carrier concentration=$1 \times 10^{19}$ cm$^{-3}$) 223, a Si-doped n-type $Al_{0.07}Ga_{0.93}N$ clad layer (thickness=12.5 nm, and carrier concentration=$1 \times 10^{18}$ cm$^{-3}$) 224, a light-emitting layer 225 having a multiple quantum structure of 6 Si-doped GaN barrier layers (thickness=14.0 nm, and carrier concentration $11 \times 10^{18}$ cm$^{-3}$) and 5 undoped $In_{0.20}Ga_{0.80}N$ well layers (thickness=2.5 nm), a Mg-doped p-type $Al_{0.07}Ga_{0.93}N$ clad layer (thickness=10 nm) 226, and a Mg-doped p-type GaN contact layer (thickness=100 nm) 227, with a buffer layer (not shown) formed of AlN interposed therebetween. The layers 222 to 227 of the laminated structure of the gallium nitride based compound semiconductor light-emitting device 20 were grown by a general low pressure MOCVD device.

The epitaxial structure of the gallium nitride based compound semiconductor 220 was used to manufacture a gallium nitride based compound semiconductor light-emitting device (see FIG. 6). First, general dry etching was performed on a region for forming an n-type electrode to expose the surface of a Si-doped n-type GaN contact layer in only the region.

(Formation of Uneven Pattern)

Next, a known photolithography technique was used to form a resist film on portions other than the surface of the p-type GaN layer. Then, the laminate was put into a vapor deposition apparatus and an Au/Sn (Sn: 30% by mass) film was formed with a thickness of 15 nm.

Then, a heat treatment was performed at a temperature of 250° C. in a nitrogen atmosphere to aggregate particles of the Au/Sn thin film, thereby forming a mask made of metal particles. The diameter of the metal particle was in the range of 0.2 to 1.5 μm, and a metal particle layer (mask) having a high density of $2 \times 10^6$ particles/mm$^2$ was formed. Then, a patterning process using the resist film was performed such that the surface of the p-type GaN layer was exposed, and general dry etching was performed thereon.

In this case, since the metal particle mask was formed in a region for the uneven pattern, the region was selectively etched by dry etching to have a shape corresponding to the shape of the metal particle mask, and the surface of the p-type GaN layer was processed into the uneven pattern having a curved surface. The convex portion was formed in a circular shape in a plan view, the average of the widths of the bottoms of the convex portions was about 0.7 μm (diameter), and the average of the heights T of the convex portions was about 1.0 μm. In addition, the average of the distances between the convex portions was 0.8 μm, and the standard deviation of the value was 50%.

Then, HF and HCl were used to clean the surface of the p-type GaN contact layer, and a transparent conductive oxide film layer made of ITO was formed on only a region for forming a positive electrode on the p-type GaN contact layer by a sputtering method. The ITO layer was formed with a thickness of about 400 nm by a DC magnetron sputter. In the sputter, an ITO target having 10% by mass of $SnO_2$ was used, and the ITO film was formed at a pressure of about 0.3 Pa. After the transparent conductive oxide film made of ITO was formed, it was subjected to a thermal annealing process at a temperature of 600° C. for one minute. In this way, the positive electrode (see reference numeral 215 in FIGS. 6 and 8) according to the invention was formed on the p-type GaN contact layer 227.

The positive electrode formed by the above-mentioned method had high transmittance, for example, a transmittance of 90% or more in a wavelength range of 460 nm. The transmittance was measured by a spectrophotometer using a sample for measuring transmittance in which a transparent conductive oxide film layer having the same thickness as described above was laminated on a glass plate. In addition, the transmittance value was calculated in consideration of a transmittance value measured from only the glass plate.

Next, a first layer (thickness=40 nm) made of Cr, a second layer (thickness=100 nm) made of Ti, and a third layer (thickness=400 nm) made of Au were sequentially formed on a portion of the transparent conductive oxide film layer (positive electrode) and the Si-doped n-type GaN contact layer 223 by a vapor deposition method, thereby forming a positive electrode bonding pad and a negative electrode.

After forming the positive electrode bonding pad and the negative electrode, the rear surface of the substrate 211 formed of sapphire was polished into a mirror surface by polishing particles, such as diamond particles. Then, the laminated structure was cut into individual square chips each having a 350 μm square, and the chip was mounted to the lead frame, and then connected to the lead frame by a gold (Au) wire.

(Measurement of Driving Voltage Vf and Emission Power Po)

A probe contacted the chip and a current of 20 mA was applied to the chip to measure a forward voltage (driving voltage: Vf). As a result, the forward voltage was 3.3 V. In addition, the emission power Po measured by a general integrating sphere was 12 mW, and it was found that light was emitted from the entire surface of the positive electrode 215.

Experimental Examples 22 to 25

Before a transparent conductive oxide film layer made of ITO was formed, a transparent conductive oxide film contact layer with a thickness of about 2 nm was formed, and a gallium nitride based compound semiconductor light-emitting device was manufactured, similar to Experimental example 21.

Experimental Example 26

Similar to Experimental example 21, a transparent conductive oxide film made of ITO was formed, and a KrF (248 nm) excimer laser was used to perform a laser annealing process on the film. The laser annealing process was performed with an emission area of 3×3 mm, an energy of 10 mJ, and a frequency of 200 Hz at one shot.

Experimental Example 27

A transparent conductive oxide film made of ITO was formed by a vapor deposition method, and the same gallium nitride based compound semiconductor light-emitting device as that in Experimental example 21 was manufactured.

Experimental Example 28

A transparent conductive oxide film layer was formed of AZO having 10% by mass of $Al_2O_3$ by a sputtering method, and the same gallium nitride based compound semiconductor light-emitting device as that in Experimental example 21 was manufactured.

Experimental Examples 29 and 30

A gallium nitride based compound semiconductor light-emitting device was manufactured, similar to Experimental example 21, except that the annealing process was performed at the temperature shown in Table 2.

Experimental Examples 31 and 32

A gallium nitride based compound semiconductor light-emitting device was manufactured, similar to Experimental example 21, except that a transparent conductive film was formed with the thickness shown in Table 2.

Experimental Example 33

A gallium nitride based compound semiconductor light-emitting device was manufactured, similar to Experimental example 21, except that a process of forming concave and convex portions on the surface of the p-type GaN layer was not performed.

Experimental Example 34

A gallium nitride based compound semiconductor light-emitting device was manufactured, similar to Experimental example 21, except that the thermal annealing process at a temperature of 600° C. was not performed.

Experimental Example 35

A gallium nitride based compound semiconductor light-emitting device was manufactured, similar to Experimental example 21, except that the cleaning process was not performed before the transparent conductive oxide film was formed.

Experimental Example 36

A Pt target was used to form a transparent conductive oxide film contact layer with a thickness of about 0.5 nm, and a gallium nitride based compound semiconductor light-emitting device was manufactured, similar to Experimental example 1.

Experimental Example 37

A gallium nitride based compound semiconductor light-emitting device was manufactured using an AZO transparent conductive oxide film layer, similar to Experimental example 28, except that the thermal annealing process at a temperature of 600° C. was not performed.

Experimental Examples 38 and 39

A gallium nitride based compound semiconductor light-emitting device was manufactured, similar to Experimental example 21, except that the annealing process was performed at the temperature shown in Table 2.

Experimental Examples 40 and 41

A gallium nitride based compound semiconductor light-emitting device was manufactured, similar to Experimental example 21, except that a transparent conductive film was formed with the thickness shown in Table 2.

Table 2 shows the formation conditions of the positive electrodes according to Experimental examples 21 to 40 and device characteristics. In addition, Table 2 shows Sn concentrations at positions that are 0, 1, 2, 5, and 10 nm away from the interface between the p-type GaN contact layer and the transparent conductive oxide film layer to the transparent conductive oxide film layer.

TABLE 2

| | | Deposition conditions | | | | | | |
|---|---|---|---|---|---|---|---|---|
| | Surface of p-type semiconductor | Cleaning before deposition | Deposition method | Contact layer | Thickness of contact layer | Transparent conductive film | Thickness of Transparent conductive film (nm) | Annealing after deposition of electrode |
| Experimental example 21 | Uneven | HF, HCl | Sputtering | | | ITO | 400 | 600° C., one minute |
| Experimental example 22 | Uneven | HF, HCl | Sputtering | Sn | 2 nm | ITO | 400 | Nothing |
| Experimental example 23 | Uneven | HF, HCl | Sputtering | Sn | 2 nm | ITO | 400 | 600° C., one minute |
| Experimental example 24 | Uneven | HF, HCl | Sputtering | $SnO_2$ | 2 nm | ITO | 400 | 600° C., one minute |
| Experimental example 25 | Uneven | HF, HCl | Sputtering | ITO ($SnO_2$: 20% by mass) | 2 nm | ITO | 400 | 600° C., one minute |
| Experimental example 26 | Uneven | HF, HCl | Sputtering | | | ITO | 400 | Laser annealing |
| Experimental example 27 | Uneven | HF, HCl | Vapor deposition | | | ITO | 400 | 600° C., one minute |
| Experimental example 28 | Uneven | HF, HCl | Sputtering | | | AZO | 400 | 600° C., one minute |
| Experimental example 29 | Uneven | HF, HCl | Sputtering | | | ITO | 400 | 800° C., one minute |
| Experimental example 30 | Uneven | HF, HCl | Sputtering | | | ITO | 400 | 250° C., one minute |
| Experimental example 31 | Uneven | HF, HCl | Sputtering | | | ITO | 900 | 600° C., one minute |
| Experimental example 32 | Uneven | HF, HCl | Sputtering | | | ITO | 60 | 600° C., one minute |

TABLE 2-continued

| | | | | | | | |
|---|---|---|---|---|---|---|---|
| Experimental example 33 | Uneven | HF, HCl | Sputtering | | ITO | 400 | 600° C., one minute |
| Experimental example 34 | Uneven | HF, HCl | Sputtering | | ITO | 400 | Nothing |
| Experimental example 35 | Uneven | Nothing | Sputtering | | ITO | 400 | 600° C., one minute |
| Experimental example 36 | Uneven | HF, HCl | Sputtering Pt | 0.5 nm | ITO | 400 | 600° C., one minute |
| Experimental example 37 | Uneven | HF, HCl | Sputtering | | AZO | 400 | Nothing |
| Experimental example 38 | Uneven | HF, HCl | Sputtering | | ITO | 400 | 1000° C., one minute |
| Experimental example 39 | Uneven | HF, HCl | Sputtering | | ITO | 400 | 200° C., one minute |
| Experimental example 40 | Uneven | HF, HCl | Sputtering | | ITO | 1200 | 600° C., one minute |
| Experimental example 41 | Uneven | HF, HCl | Sputtering | | ITO | 30 | 600° C., one minute |

| | Device characteristics | | Dopant concentration/% | | | | | |
|---|---|---|---|---|---|---|---|---|
| | Vf/V | Po/mW | 0 nm from interface | 1 nm from interface | 2 nm from interface | 3 nm from interface | 5 nm from interface | 10 nm from interface |
| Experimental example 21 | 3.3 | 12 | 16 | 15 | 8 | 10 | 7 | 7 |
| Experimental example 22 | 3.3 | 12 | 17 | 17 | 10 | 11 | 8 | 8 |
| Experimental example 23 | 3.2 | 12 | 19 | 13 | 7 | 9 | 6 | 9 |
| Experimental example 24 | 3.2 | 12 | 18 | 12 | 9 | 10 | 9 | 8 |
| Experimental example 25 | 3.2 | 12 | 20 | 12 | 11 | 11 | 9 | 10 |
| Experimental example 26 | 3.3 | 12 | 20 | 20 | 13 | 12 | 12 | 11 |
| Experimental example 27 | 3.3 | 12 | 16 | 16 | 12 | 13 | 9 | 8 |
| Experimental example 28 | 3.5 | 12 | 15 | 15 | 8 | 10 | 7 | 8 |
| Experimental example 29 | 3.3 | 12 | 22 | 19 | 18 | 16 | 10 | 8 |
| Experimental example 30 | 3.4 | 12 | 14 | 13 | 12 | 9 | 8 | 6 |
| Experimental example 31 | 3.2 | 11 | 18 | 16 | 14 | 11 | 10 | 9 |
| Experimental example 32 | 3.5 | 12 | 17 | 18 | 14 | 12 | 10 | 8 |
| Experimental example 33 | 3.3 | 10 | 15 | 14 | 10 | 11 | 10 | 9 |
| Experimental example 34 | 3.6 | 12 | 10 | 11 | 10 | 9 | 10 | 10 |
| Experimental example 35 | 3.6 | 12 | 12 | 13 | 10 | 10 | 8 | 10 |
| Experimental example 36 | 3.3 | 9 | 4 | 7 | 8 | 8 | 7 | 8 |
| Experimental example 37 | 3.7 | 12 | 12 | 10 | 8 | 9 | 10 | 10 |
| Experimental example 38 | 3.7 | 12 | 20 | 21 | 18 | 17 | 14 | 11 |
| Experimental example 39 | 3.7 | 12 | 14 | 12 | 13 | 10 | 8 | 8 |
| Experimental example 40 | 3.2 | 9 | 18 | 16 | 13 | 11 | 10 | 8 |
| Experimental example 41 | 3.8 | 12 | 17 | 16 | 14 | 11 | 9 | 8 |

According to the evaluation results of the device characteristics shown in Table 2, in the chips subjected to the thermal annealing process at a temperature of 600° C., the Sn concentration is high at the position that is 2 nm or less away from the interface between the p-type GaN layer and the ITO layer, and the driving voltage Vf is reduced (for example, Experimental example 21).

In addition, when the thermal annealing temperature is 800° C. (Experimental example 9) or 250° C. (Experimental example 10), the Sn concentration is high at the position that is 2 nm or less away from the interface, and the driving voltage Vf is reduced. Further, when the thickness of the transparent conductive oxide film is 900 nm (Experimental example 31) or 60 nm (Experimental example 32), the Sn concentration is high at the position that is 2 nm or less away from the interface, and the driving voltage Vf is reduced.

Further, in the chips not subjected to the thermal annealing process, it is possible to form a region having a high Sn concentration by forming a Sn contact layer before an ITO layer is formed. Therefore, the driving voltage Vf is reduced (Experimental example 22). In the chip having a Sn contact layer formed therein and subjected to the thermal annealing process, a region having a high Sn concentration exists at a position closer to the interface. Therefore, the driving voltage Vf is further reduced (Experimental examples 23 to 25).

In addition, the region having a high Sn concentration also exists in the chip subjected to a laser annealing process instead of the thermal annealing process at a temperature of 600° C. (Experimental example 26) or the chip having an ITO film formed by a vapor deposition method (Experimental example 27).

In the chips having an uneven pattern formed on the surface of the p-type GaN layer (Experimental examples 21 to 28), the emission power is about 2 mW higher than that when no uneven pattern is formed (Experimental example 33). Further, as described above, in the chip having the uneven pattern formed therein (for example, Experimental example 21), the Sn concentration is high at the position that is 2 nm or less away from the interface between the p-type GaN layer and the ITO layer, and the driving voltage Vf is equal to that of the chip having no uneven pattern (Experimental example 33).

When an AZO film is formed as the transparent conductive oxide film (Experimental example 28), the driving voltage Vf is higher than that when an ITO film is formed. However, like the ITO film, a region that is highly doped with Al is formed by the thermal annealing process at a temperature of 600° C., and the driving voltage Vf is reduced. During a peeling test, when the ITO film is peeled off, about 70 lattices remain. However, when the AZO film is peeled off, 100 lattices all remain. As a result, the AZO film requires a higher driving voltage Vf than the ITO film, but has higher adhesion than the ITO film.

In Experimental example 33 in which no uneven pattern is formed on the surface of the p-type GaN layer, the driving voltage Vf was 3.3 V, and the emission power Po was 10 mW.

In Experimental example 34 in which the thermal annealing process was not performed after the transparent conductive oxide film is formed, no region having a high Sn concentration existed in the range that is up to 10 nm away from the interface between the p-type GaN layer and the ITO layer. In Experimental example 34, the driving voltage Vf of the light-emitting device was 3.6 V.

In Experimental example 35 in which the p-type GaN layer was not cleaned before the transparent conductive oxide film was formed, a region having a slightly high Sn concentration existed in the range that is 1 nm away from the interface between the p-type GaN layer and the ITO layer. In Experimental example 35, the driving voltage Vf of the light-emitting device was 3.6 V.

In Experimental example 36 in which a Pt target was used to form the transparent conductive oxide film contact layer with a thickness of about 0.5 nm, the dopant concentration was 4% at the interface. In Experimental example 36, the emission power Po of the light-emitting device was 9 mW.

In Experimental example 37 in which the transparent conductive oxide film was formed of AZO and the thermal annealing process at a temperature of 600° C. was not performed, no region having a high Sn concentration existed up to 10 nm away from the interface between the p-type GaN layer and the ITO layer. In Experimental example 37, the driving voltage Vf of the light-emitting device was 3.7 V.

In Experimental example 38 in which, after the transparent conductive oxide film was formed, the thermal annealing temperature process was performed at a temperature of 1000° C., the segregation of the Sn concentration was accelerated up to 2 nm away from the interface. In Experimental example 38, the driving voltage Vf of the light-emitting device was 3.7 V.

In Experimental example 39 in which, after the transparent conductive oxide film was formed, the thermal annealing process was performed at a temperature of 200° C., the driving voltage Vf of the light-emitting device was 3.7 V.

In Experimental example 40 in which the transparent conductive oxide film was formed with a large thickness of 1200 nm, the segregation of the Sn concentration was accelerated up to 2 nm away from the interface. In Experimental example 40, the emission power Po of the light-emitting device was 9 mW.

In Experimental example 41 in which the transparent conductive oxide film was formed with a small thickness of 30 nm, the segregation of the Sn concentration was accelerated up to 2 nm away from the interface. In Experimental example 41, the driving voltage Vf of the light-emitting device was 3.8 V.

The above-mentioned results prove that the gallium nitride based compound semiconductor light-emitting device according to the invention has high light emission efficiency, a low driving voltage Vf, and high device characteristics.

INDUSTRIAL APPLICABILITY

The invention can be applied to a gallium nitride based compound semiconductor light-emitting device, particularly, a gallium nitride based compound semiconductor light-emitting device having a low driving voltage Vf and a method of manufacturing the same.

The invention claimed is:
1. A gallium nitride based compound semiconductor light-emitting device including:
   a gallium nitride based compound semiconductor device including a p-type semiconductor layer; and
   a transparent conductive oxide film that includes dopants and is formed on the p-type semiconductor layer,
   wherein a dopant concentration at an interface between the p-type semiconductor layer and the transparent conductive oxide film is higher than a bulk dopant concentration of the transparent conductive oxide film, and
   wherein the dopant concentration of the transparent conductive oxide film is 15 at % or more in the region that is 2 nm or less away from the interface and the dopant concentration is 5 to 10 at % in the region that is 2 nm or more away from the interface.

2. The gallium nitride based compound semiconductor light-emitting device according to claim 1,
wherein an uneven surface is formed on at least a portion of the p-type semiconductor layer.

3. The gallium nitride based compound semiconductor light-emitting device according to claim 1,
wherein the dopant concentration of the transparent conductive oxide film is the highest at the interface between the transparent conductive oxide film and the p-type semiconductor layer.

4. The gallium nitride based compound semiconductor light-emitting device according to claim 1,
wherein a highly doped region having a dopant concentration that is higher than that of the transparent conductive oxide film is provided between the p-type semiconductor layer and the transparent conductive oxide film.

5. The gallium nitride based compound semiconductor light-emitting device according to claim 4,
wherein the highly doped region is formed of any one of a dopant, a dopant oxide, and a transparent conductive material having a dopant concentration that is higher than that of the transparent conductive oxide film.

6. The gallium nitride based compound semiconductor light-emitting device according to claim 4,
wherein the highly doped region is formed of any one of Sn, $SnO_2$, and ITO($In_2O_3$—$SnO_2$) having a Sn concentration that is higher than that of the transparent conductive oxide film.

7. The gallium nitride based compound semiconductor light-emitting device according to claim 1,
wherein the transparent conductive oxide film is formed of at least one of ITO($In_2O_3$—$SnO_2$), AZO($ZnO$—$Al_2O_3$), IZO($In_2O_3$—$ZnO$), and GZO($ZnO$—$GeO_2$).

8. The gallium nitride based compound semiconductor light-emitting device according to claim 7,
wherein the transparent conductive oxide film contains at least ITO($In_2O_3$—$SnO_2$).

9. The gallium nitride based compound semiconductor light-emitting device according to claim 1,
wherein the thickness of the transparent conductive oxide film is in the range of 35 nm to 10000 nm (10 μm).

10. The gallium nitride based compound semiconductor light-emitting device according to claim 1,
wherein the thickness of the transparent conductive oxide film is in the range of 100 nm to 1000 nm (1 μm).

11. A lamp including the gallium nitride based compound semiconductor light-emitting device according to claim 1.

* * * * *